(12) United States Patent
Shapira et al.

(10) Patent No.: US 11,362,671 B2
(45) Date of Patent: Jun. 14, 2022

(54) SYSTEMS AND METHODS OF DATA COMPRESSION

(71) Applicants: Ariel Scientific Innovations Ltd., Ariel (IL); Bar-Ilan University, Ramat Gan (IL)

(72) Inventors: Dana Shapira, Modiin (IL); Shmuel Tomi Klein, Rehovot (IL); Aharon Fruchtman, Karney Shomron (IL); Yoav Gross, Revava (IL); Shoham Saadia, Elkana (IL); Nir Nini, Shtulim (IL)

(73) Assignees: Ariel Scientific Innovations Ltd., Ariel (IL); Bar-Ilan University, Ramat-Gan (IL)

( * ) Notice: Subject to any disclaimer, the term of this patent is extended or adjusted under 35 U.S.C. 154(b) by 0 days.

(21) Appl. No.: 17/438,552

(22) PCT Filed: Mar. 19, 2020

(86) PCT No.: PCT/IL2020/050332
§ 371 (c)(1),
(2) Date: Sep. 13, 2021

(87) PCT Pub. No.: WO2020/194292
PCT Pub. Date: Oct. 1, 2020

(65) Prior Publication Data
US 2022/0094370 A1  Mar. 24, 2022

Related U.S. Application Data

(60) Provisional application No. 62/823,095, filed on Mar. 25, 2019, provisional application No. 62/952,516, filed on Dec. 23, 2019.

(51) Int. Cl.
*H03M 7/40* (2006.01)
*H03M 7/30* (2006.01)

(52) U.S. Cl.
CPC ......... *H03M 7/405* (2013.01); *H03M 7/3059* (2013.01); *H03M 7/3066* (2013.01); *H03M 7/6011* (2013.01)

(58) Field of Classification Search
CPC .................................. H03M 7/30; H03M 7/40
See application file for complete search history.

(56) References Cited

U.S. PATENT DOCUMENTS

| | | | | |
|---|---|---|---|---|
| 4,882,754 A | * | 11/1989 | Weaver | H03M 7/42 375/240 |
| 5,812,071 A | * | 9/1998 | Kairouz | H04N 19/60 375/E7.14 |

(Continued)

FOREIGN PATENT DOCUMENTS

| | | |
|---|---|---|
| CN | 102811114 | 12/2012 |
| CN | 107483059 | 12/2017 |
| WO | WO 2021/130754 | 7/2021 |

OTHER PUBLICATIONS

International Search Report and the Written Opinion dated Jun. 4, 2020 From the International Searching Authority Re. Application No. PCT/IL2020/050332. (13 Pages).

(Continued)

*Primary Examiner* — Lam T Mai

(57) ABSTRACT

There is provided a computer-implemented method of compressing a baseline dataset, comprising: creating a weight function that calculates a weight for each instance of each unique data elements in the baseline dataset, as a function of sequential locations of each of the instances of each respective unique data element within the baseline dataset, creating an output dataset storing a codeword for each one of the unique data elements, wherein codewords are according to a compression rule defining data elements associated with a relatively higher weight as being associated with codewords that are relatively shorter, dynamically creating the com- (Continued)

pressed dataset by sequentially iterating, for each current sequential location of the baseline dataset: determining an encoded data element mapped to the respective data element of the current sequential location according to the weight function, and adjusting the codewords of the output dataset according to the current weights to maintain the compression rule.

20 Claims, 15 Drawing Sheets

(56) References Cited

U.S. PATENT DOCUMENTS

| | | | | |
|---|---|---|---|---|
| 5,945,933 | A | 8/1999 | Kalkstein | |
| 7,558,685 | B2 * | 7/2009 | Wegener | G06F 17/141 |
| | | | | 702/77 |
| 8,427,346 | B2 * | 4/2013 | Potkonjak | H03M 7/30 |
| | | | | 341/51 |
| 9,747,910 | B2 * | 8/2017 | Kim | H04S 3/008 |
| 10,169,359 | B1 | 1/2019 | Pinho et al. | |
| 2004/0113820 | A1 * | 6/2004 | Leanza | H03M 7/30 |
| | | | | 341/50 |
| 2004/0145503 | A1 * | 7/2004 | Blanch | G01V 1/48 |
| | | | | 341/76 |
| 2004/0150538 | A1 * | 8/2004 | Kim | H04N 19/91 |
| | | | | 341/67 |
| 2008/0111721 | A1 * | 5/2008 | Reznik | H04N 19/91 |
| | | | | 341/67 |
| 2008/0111722 | A1 * | 5/2008 | Reznik | H03M 7/40 |
| | | | | 341/67 |
| 2009/0140895 | A1 | 6/2009 | Owsley et al. | |
| 2011/0025532 | A1 * | 2/2011 | Markram | H04L 25/493 |
| | | | | 341/61 |
| 2017/0063392 | A1 | 3/2017 | Kalevo et al. | |
| 2017/0346502 | A1 | 11/2017 | Cideciyan et al. | |
| 2020/0364545 | A1 * | 11/2020 | Shattil | G06N 3/08 |

OTHER PUBLICATIONS

International Search Report and the Written Opinion sated Mar. 25, 2021 From the International Searching Authority Re. Application No. PCT/IL2020/051324. (10 Pages).

Fruchtman et al., "Bidirectional Adaptive Compression", Proceedings of Prague Stringology Conference, PSC 2019, p. 92-101, Aug. 2019.

Gallager, "A Method for the Construction of Minimum-Redundancy Codes", Proceedings of the I.R.E., 40(9): 1098-1101, Sep. 1952.

Klein et al., "Forward Looking Huffman Coding", Computer Science—Theory and Applications, Proceedings of the 14th International Computer Science Symposium, CSR 2019, Novosibirsk, Russia, Jul. 1-5, 2019, LNCS 11532: 203-214, Jul. 1, 2019.

Knuth, "Dynamic Huffman Coding", Journal of Algorithms, 6(2): 163-180, Jun. 1985.

Moffat, "World-Based Text Compression", Software—Practice and Experience, 19(2): 185-198, Feb. 1989.

Nelson et al., The Data Compression Book, 2nd Ed., 403 P., 1995.

Storer et al., "Data Compression Via Textual Substitution", Journal of Association for Computing Machinery, 29(4): 928-951, Oct. 1982.

Vitter, "Design and Analysis of Dynamic Huffman Codes", Journal of the Association for Computing Machinery, 34(4): 825-845, Oct. 1997.

Huffman, "A Method for the Construction of Minimum-Redundancy Codes", Proceedings of the I.R.E., 40(9): 1098-1101, Sep. 1952.

International Preliminary Report on Patentability dated Oct. 7, 2021 From the International Bureau of WIPO Re. Application No. PCT/IL2020/050332. (6 Pages).

International Search Report and the Written Opinion dated Mar. 25, 2021 From the International Searching Authority Re. Application No. PCT/IL2020/051324. (10 Pages).

Gallager "Variations on a Theme by Huffman", IEEE Transactions on Information Theory, IT-24(6): 668-674, Nov. 1978.

* cited by examiner

| | Weights | | | c | c | a | b | b | b | c | a | a | a |
|---|---|---|---|---|---|---|---|---|---|---|---|---|---|
| | a | b | c | | | | | | | | | | |
| POSITIONAL | 14 | 18 | 23 | 0 | 10 | 11 | 0 | 0 | 0 | 11 | ... | ... | ... |
| VITTER | ... | ... | ... | 11 | 0 | 11 | 10 | 10 | 11 | 0 | 11 | 10 | 10 |
| FORWARD | 4 | 3 | 3 | 11 | 10 | 0 | 11 | 11 | 11 | 0 | ... | ... | ... |

*The encoding of T = ccabbbcaaa using the three adaptive techniques.*

|   | 1 | 2 | 3 | 4 | 5 | 6 | 7 | 8 | 9 | 10 |
|---|---|---|---|---|---|---|---|---|---|---|
| $T$ | c | c | a | b | b | b | c | a | a | a |
| $g_1(i)$ | 1 | 1 | 1 | 1 | 1 | 1 | 1 | 1 | 1 | 1 |
| $g_2(i)$ | 2 | 2 | 2 | 2 | 2 | 2 | 2 | 2 | 2 | 1 |
| $g_3(i)$ | 3 | 3 | 3 | 3 | 3 | 3 | 3 | 3 | 2 | 1 |
| $g_4(i)$ | 4 | 4 | 4 | 4 | 4 | 4 | 4 | 3 | 2 | 1 |
| ... | | | | | | | | | | |
| $p(i)$ | 10 | 9 | 8 | 7 | 6 | 5 | 4 | 3 | 2 | 1 |

*Positional Coding example for $T$ = abbbcaaa*

602

1102

```
1  Initialize a Huffman tree according to the frequencies within T
2  for k ← 1 to n − 1 do
3      output the codeword for leaf($x_k$)
4      p ← leaf($x_k$)
5      while p ≠ root do
6          q ← lowest numbered node with same weight as p
7          if q ≠ p then
8              interchange p with q
9          decrement p's weight by 1
10         p ← parent of p
11     p ← leaf($x_k$)
12     if p's weight is 0 then
13         replace p's parent node by p's sibling
14         delete the leaf p
```

FIG. 11

| File | full size MB | m | Compression ratio | | |
|---|---|---|---|---|---|
| | | | STATIC | FORWARD | DYNAMIC |
| ftxt | 7.6 | 127 | 0.583 | 0.578 | 0.577 |
| sources | 200 | 208 | 0.699 | 0.686 | 0.647 |
| English | 50 | 217 | 0.580 | 0.571 | 0.566 |
| exe | 0.02 | 256 | 0.665 | 0.631 | 0.634 |
| bible | 4.3 | 22,180 | 0.236 | 0.234 | 0.245 |

FIG. 12

SYSTEMS AND METHODS OF DATA COMPRESSION

RELATED APPLICATIONS

This application is a National Phase of PCT Patent Application No. PCT/IL2020/050332 having International filing date of Mar. 19, 2020, which claims the benefit of priority under 35 USC § 119(e) of U.S. Provisional Patent Application Nos. 62/823,095 filed on Mar. 25, 2019, and 62/952,516 filed on Dec. 23, 2019. The contents of the above applications are all incorporated by reference as if fully set forth herein in their entirety.

FIELD AND BACKGROUND OF THE INVENTION

The present invention, in some embodiments thereof, relates to data compression and, more specifically, but not exclusively, to systems and methods for creation of a compressed dataset.

A compressed dataset stores the same information as the original non-compressed dataset, in a reduced size, for example, requiring a smaller amount of memory for storage. Compression may be lossless, where size is reduced by identifying and removing redundancy. No information is lost in lossless compression. Compression of a dataset is sometimes referred to as encoding. The original dataset is recovered from the compressed dataset by a process sometimes referred to as decoding. Compressed datasets require fewer data storage resources for storage, and/or require fewer network resources for transmission, in comparison to the larger original (i.e., non-compressed) dataset.

Huffman coding is one example of a process used for lossless data compression.

SUMMARY OF THE INVENTION

According to a first aspect, a computer implemented method of compressing a baseline dataset comprising a sequence of a plurality of instances of a plurality of unique data elements, the method comprises: creating a weight function that calculates a weight for each one of the plurality of instances of each one of the plurality of unique data elements in the baseline dataset, as a function of sequential locations of each of the plurality of instances of each respective unique data element within the baseline dataset, creating an output dataset storing a codeword for each one of the unique data elements in the baseline dataset, wherein codewords are according to a compression rule defining data elements associated with a relatively higher weight as being associated with codewords that are relatively shorter in comparison to data elements associated with relatively lower weight, dynamically creating the compressed dataset by sequentially iterating, for each current sequential location of the baseline dataset: determining an encoded data element mapped to the respective data element of the current sequential location according to the weight function, and adjusting the codewords of the output dataset according to the current weights to maintain the compression rule.

According to a second aspect, a system for compressing a baseline dataset comprising a sequence of a plurality of instances of a plurality of unique data elements, the system comprises: at least one hardware processor executing a code for: creating a weight function that calculates a weight for each one of the plurality of instances of each one of the plurality of unique data elements in the baseline dataset, as a function of sequential locations of each of the plurality of instances of each respective unique data element within the baseline dataset, creating an output dataset storing a codeword for each one of the unique data elements in the baseline dataset, wherein codewords are according to a compression rule defining data elements associated with a relatively higher weight as being associated with codewords that are relatively shorter in comparison to data elements associated with relatively lower weight, dynamically creating the compressed dataset by sequentially iterating, for each current sequential location of the baseline dataset: determining an encoded data element mapped to the respective data element of the current sequential location according to the weight function, and adjusting the codewords of the output dataset according to the current weights to maintain the compression rule.

According to a third aspect, a computer program product for compressing a baseline dataset comprising a sequence of a plurality of instances of a plurality of unique data elements, the computer program product comprises: a non-transitory memory storing thereon code for execution by at least one hardware process, the code including instructions for: creating a weight function that calculates a weight for each one of the plurality of instances of each one of the plurality of unique data elements in the baseline dataset, as a function of sequential locations of each of the plurality of instances of each respective unique data element within the baseline dataset, creating an output dataset storing a codeword for each one of the unique data elements in the baseline dataset, wherein codewords are according to a compression rule defining data elements associated with a relatively higher weight as being associated with codewords that are relatively shorter in comparison to data elements associated with relatively lower weight, dynamically creating the compressed dataset by sequentially iterating, for each current sequential location of the baseline dataset: determining an encoded data element mapped to the respective data element of the current sequential location according to the weight function, and adjusting the codewords of the output dataset according to the current weights to maintain the compression rule.

According to a fourth aspect, a computer implemented method of compressing a baseline dataset comprising a sequence of data elements, the method comprising: creating a weight dataset that stores a weight of each one of the data elements in the baseline dataset and an associated output dataset storing a codeword for each one of the data elements in the baseline dataset, wherein codewords are according to a compression rule defining data elements associated with a relatively higher weight as being associated with codewords that are relatively shorter in comparison to data elements associated with relatively lower weight, dynamically creating the compressed dataset by sequentially computing, for each respective data element of the baseline dataset: an encoded data element mapped to the respective data element according to the weight dataset, updating the weight dataset by decrementing the weight of the respective data element, and adjusting the codewords of the output dataset according to the updating to maintain the compression rule.

According to a fifth aspect, a system for compressing a baseline dataset comprising a sequence of data elements, the system comprising: at least one hardware processor executing a code for: creating a weight dataset that stores a weight of each one of the data elements in the baseline dataset and an associated output dataset storing a codeword for each one of data elements in the baseline dataset, wherein codewords are according to a compression rule defining data elements associated with a relatively higher weight as being associated with codewords that are relatively shorter in comparison to data elements associated with relatively lower weight, dynamically creating the compressed dataset by sequentially computing, for each respective data element of the baseline dataset: an encoded data element mapped to the respective data element according to the weight dataset, updating the weight dataset by decrementing the weight of the respective data element, and adjusting the codewords of the output dataset according to the updating to maintain the compression rule.

According to a sixth aspect, a computer program product for compressing a baseline dataset comprising a sequence of a plurality of data elements, the computer program product comprising: a non-transitory memory storing thereon code for execution by at least one hardware process, the code including instructions for: creating a weight dataset that stores a weight of each one of the data elements in the baseline dataset and an associated output dataset storing a codeword for each one of the data elements in the baseline dataset, wherein codewords are according to a compression rule defining data elements associated with a relatively higher weight as being associated with codewords that are relatively shorter in comparison to data elements associated with relatively lower weight, dynamically creating the compressed dataset by sequentially computing, for each respective data elements of the baseline dataset: an encoded data element mapped to the respective data element according to the weight dataset, updating the weight dataset by decrementing the weight of the respective data element, and adjusting the codewords of the output dataset according to the updating to maintain the compression rule.

In a further implementation form of the first, second, and third aspects, the weight of a certain instance of a certain data element at a current sequential location is computed as a function of values of the weight function computed for each instance of the certain data element for subsequent sequential locations following the current sequential location.

In a further implementation form of the first, second, and third aspects, the weight of a certain instance of a certain data element at a current sequential location is computed as a function of values of the weight function computed for each instance of the certain data element for previous sequential locations previous to the current sequential location.

In a further implementation form of the first, second, and third aspects, the value of the weight function decreases with increasing sequential locations away from a first sequential location of the baseline dataset.

In a further implementation form of the first, second, and third aspects, the weight function decreases linearly.

In a further implementation form of the first, second, and third aspects, each sequential location is indexed with a decreasing integer value from a start of the baseline dataset, representing the number of remaining plurality of instances of each one of the plurality of unique data elements in the baseline dataset.

In a further implementation form of the first, second, and third aspects, further comprising creating a header comprising an initial weight for each one of the plurality of unique data elements in the baseline dataset computed for a first location of the baseline dataset according to the weight function computed for sequential locations of each of the plurality of instances of each respective unique data element, and providing the header and the compressed dataset to a decoder for decoding.

In a further implementation form of the first, second, and third aspects, the sequential iterations are performed until a single unique data element with at least one instance remains in the remaining portion of the baseline dataset, the output dataset excludes encodings of the remaining at least one instance of the single unique data element, and wherein a decoder computes a number of the remaining at least one instance of the single unique data element according to the weight of the single data element computed by the weight function for a last sequential location.

In a further implementation form of the first, second, and third aspects, further comprising initializing a weighted tree associated with the values of the weight function computed for each of the plurality of data elements for a first sequential position, and the output dataset is considered as being equivalent to the weighted tree, the weighted tree having a number of leaves corresponding to a number of unique data elements.

In a further implementation form of the first, second, and third aspects, the weight tree comprises a Huffman tree.

In a further implementation form of the first, second, and third aspects, the baseline dataset having a baseline data storage size is compressed to generate the compressed dataset having a data storage size that is smaller than the baseline data storage.

In a further implementation form of the first, second, and third aspects, the dynamically creating the compressed dataset is implemented as a statistical encoder.

In a further implementation form of the first, second, and third aspects, the statistical encoder is selected from a group consisting of: dynamic Huffman coding, adaptive arithmetic coding, and Prediction by Partial Mapping (PPM).

In a further implementation form of the first, second, and third aspects, the data elements are selected as belonging to an alphabet.

In a further implementation form of the first, second, and third aspects, the alphabet is selected from the group consisting of: ASCII, EBCDIC, and UNICODE.

In a further implementation form of the first, second, and third aspects, the alphabet includes elements, each of which is a string of at least one character.

In a further implementation form of the first, second, and third aspects, the elements are words of a natural language.

In a further implementation of the fourth, fifth, and sixth aspect, the baseline dataset having a baseline data storage size is compressed to generate the compressed dataset having a data storage size that is smaller than the baseline data storage.

In a further implementation of the fourth, fifth, and sixth aspect, further comprising removing a certain data element and associated codeword from the weight dataset and output dataset when the weight of the certain data element reaches a value indicating a last occurrence of the certain data element in the remaining portion of the baseline dataset.

In a further implementation of the fourth, fifth, and sixth aspect, the weight associated with a certain data element is indicative of a frequency of the certain data element in the remaining portion of the baseline dataset.

In a further implementation of the fourth, fifth, and sixth aspect, a binary weighted tree is associated with the weight dataset, and the output dataset is considered as being equivalent to the binary weighted tree, wherein the binary weighted tree having a number of leaves corresponding to a number of different data elements, and weights according to number of occurrences of the respective data element in the remaining portion of the baseline dataset.

In a further implementation of the fourth, fifth, and sixth aspect, the tree comprises a Huffman tree.

In a further implementation of the fourth, fifth, and sixth aspect, further comprising, prior to updating the weight dataset by decrementing the weight associated with the respective element, swapping nodes on a path from a leaf node of the respective element to a root node with a smallest numbered node of identical weight, wherein the weight of the respective element is decremented without violating a sibling property.

In a further implementation of the fourth, fifth, and sixth aspect, the dynamically creating the compressed dataset is implemented as a statistical encoder.

In a further implementation of the fourth, fifth, and sixth aspect, the statistical encoder is selected from a group consisting of: dynamic Huffman coding, and dynamic arithmetic coding.

In a further implementation of the fourth, fifth, and sixth aspect, the data elements are selected as belonging to an alphabet.

In a further implementation of the fourth, fifth, and sixth aspect, the alphabet is selected from the group consisting of: ASCII, EBCDIC, and UNICODE.

In a further implementation of the fourth, fifth, and sixth aspect, the alphabet includes elements, each of which is a string of at least one character.

In a further implementation of the fourth, fifth, and sixth aspect, the elements are words of a natural language.

In a further implementation of the fourth, fifth, and sixth aspect, the updating the weight dataset is performed after encoding a plurality of data elements.

In a further implementation of the fourth, fifth, and sixth aspect, an initial state of the weight dataset stores frequencies representing an actual distribution of the data elements in the baseline dataset.

In a further implementation of the fourth, fifth, and sixth aspect, the weight of each one of the data elements in the baseline dataset stored an initial state of the weight dataset is computed from at least one other dataset estimated to be statistically similar to the baseline dataset.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE SEVERAL VIEWS OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIG. 5 is a table summarizing the encodings during the encoding approach described herein, the VITTER approach, and the approach described with reference to FIG. 1B, in accordance with some embodiments of the present invention;

FIG. 11 is a pseudo-code of an exemplary implementation of the encoding process described herein, in accordance with some embodiments of the present invention;

FIG. 12 is a table summarizing the compression performance results, in accordance with some embodiments of the present invention.

DESCRIPTION OF SPECIFIC EMBODIMENTS OF THE INVENTION

Figure 1A:
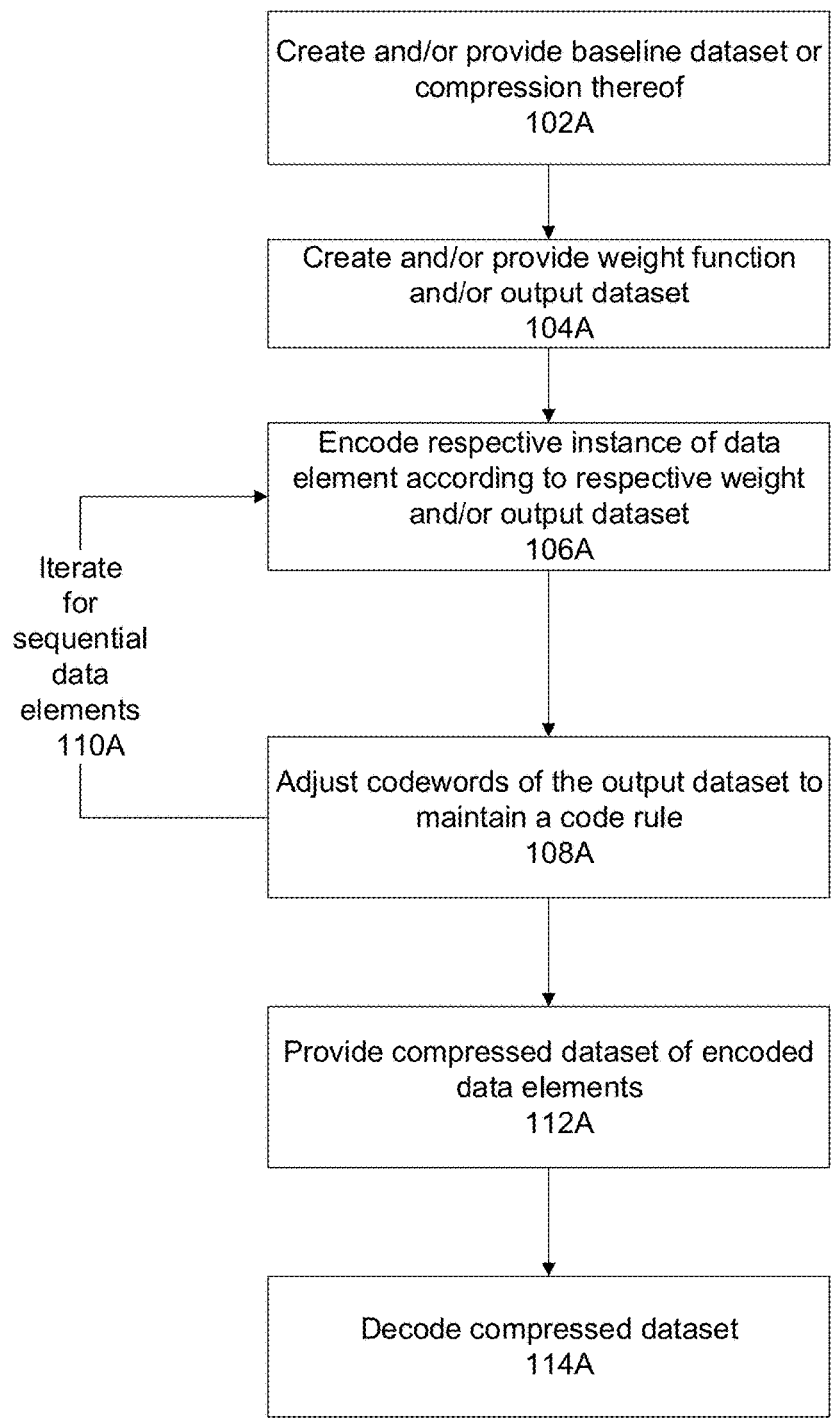
FIG. 1A is a flowchart of a method of compressing a baseline dataset according to weights of each one of the unique data elements in the baseline dataset based on sequential positions of instances of the respective unique data elements within the baseline dataset, in accordance with some embodiments of the present invention.

The present invention, in some embodiments thereof, relates to data compression and, more specifically, but not exclusively, to systems and methods for creation of a compressed dataset.

An aspect of some embodiments of the present invention relates to systems, methods, an apparatus, and/or code instructions (i.e., stored in a data storage device, executable by one or more hardware processors) for compressing a baseline dataset based on locations of data elements within the baseline dataset. The baseline dataset includes a sequence of instances of data elements, for example, a file of text, where the data elements are defined as individual characters, or where the data elements are defined as words, and/or symbols (e.g., text and/or non-text) where the symbols may be defined as individual symbols and/or sets of two or more symbols (e.g., strings). The data elements, each one of which appears one or more times in the baseline dataset, are defined by a set, for example, an alphabet and/or set of symbols and/or set of characters. A weight function is defined. The weight function calculates a weight for each one of instances of each one of the data elements in the baseline dataset, as a function of sequential locations of each of the instances of each respective data element within the baseline dataset. The sequential locations may be defined relative to the first data element of the baseline dataset denoted as an index value of one, with each sequential data element denoted by an incrementally increasing value of the index value. An output dataset storing a codeword for converting each data element to an encoded data element is created. The codewords are according to a compression rule. The compression rule defines that data elements associated with a relatively higher weight are associated with codewords that are relatively shorter in comparison to data elements associated with relatively lower weight. In other words, the closer the occurrence(s) of instances of a certain data element to a reference sequential position (e.g., the start of the baseline dataset) the shorter the codeword representing the certain data element. The shorter codewords for instances of data elements located closer to the reference sequential position (e.g., the start of the baseline dataset) are selected to potentially produce an overall improved compression of the baseline dataset in comparison to other compression processes, as described herein. The compressed dataset is dynamically created by sequentially computing an encoded data element mapped to each respective data element of the baseline dataset, according to the output dataset and/or weight function. The codewords of the output dataset are adjusted according to the current weights to maintain the compression rule. The encoded elements are arranged into the compressed dataset, where the storage size of the compressed dataset is smaller than the storage size of the non-compressed baseline dataset. The compressed dataset may be provided to an encoder for decompressing the compressed dataset to obtain the baseline dataset.

At least some implementations of the systems, methods, apparatus, and/or code instructions (i.e., stored in a data storage device and executable by one or more hardware processors) improve the field of data compression, in particular, improve upon the data compression process based on static and/or dynamic encoding, for example, Huffman based encoding. The improvement in data compression improves performance of a data storage device and/or network, by requiring fewer data storage resources for storage of the compressed dataset and/or requiring fewer network resources for transmission of the compressed dataset (e.g., smaller bandwidth), in comparison to a dataset compressed using static and/or dynamic encoding processes, such as Huffman based encoding. The improvement in compression is at least obtained by encoding based on a weight function that calculates a weight for each one of instances of each one of unique data elements in the baseline dataset, as a function of sequential locations of each of the instances of each respective unique data element within the baseline dataset.

Inventors discovered that assigning relatively higher weights to data elements that are relatively closer to a reference location in the baseline dataset being encoded (e.g., the first data element of the baseline dataset) increases compression performance.

Huffman coding, described with reference to David A. Huffman. *A method for the construction of minimum-redundancy codes. Proceedings of the IRE*, 40(9):1098-1101, 1952, is one of the seminal techniques in data compression and is applied on a set of types of data elements denoted $\Sigma$ into which a given input dataset (e.g., file) denoted F can be partitioned. $\Sigma$ may be referred to as an alphabet, and the data elements of the alphabet may be referred to as characters, but these terms are to be understood in a broader sense, and the characters may consist of strings or words, as long as there is a well defined way to break F into a sequence of data elements of $\Sigma$. There may be multiple instances of the same types of data elements, for example, the dataset "aaaaa" includes five instances of the data element "a". Each "a" may sometimes be referred to as a data element, sometimes of the same type of data element.

Huffman coding is known to be optimal in case the alphabet is known in advance, the set of codewords is fixed and each codeword consists of an integral number of bits. If one of these conditions is violated, optimality is not guaranteed.

In the dynamic variant of Huffman coding, also known as adaptive, the encoder and decoder maintain identical copies of the model; at each position, the model consists of the frequencies of the elements processed so far. After each processed data element denoted $\sigma$, the model is updated by incrementing the frequency of $\sigma$ by 1, while the other frequencies remain the same. Newton Faller. *An adaptive system for data compression. In Record of the 7-th Asilomar Conference on Circuits, Systems and Computers*, pages 593-597, 1973 (hereinafter "Faller") and Robert Gallager. *Variations on a theme by Huffman. IEEE Transactions on Information Theory*, 24(6):668-674, 1978 (hereinafter "Gallager") propose a one-pass solution for dynamic Huffman coding. Donald E Knuth. *Dynamic Huffman coding. Journal of Algorithms*, 6(2):163-180, 1985 (hereinafter "Knuth") extends Gallager's work and also suggests that the frequencies may be decreased as well as increased, which enables the usage of a sliding window rather than relying on the full history. These independent adaptive Huffman coding methods are known as the FGK algorithm. Jeffrey S. Vitter. *Design and analysis of dynamic Huffman codes. J. ACM*, 34(4):825-845, 1987 (hereinafter "Vitter") proposes an improved technique with additional properties and proves that the number of bits needed in order to encode a message of n characters using Vitter's variant, is bounded by the size of the compressed dataset resulting from the optimal two-pass static Huffman algorithm, plus n. In practice, Vitter's method produces often smaller datasets than static Huffman coding, but not always, and an example for which Vitter's dynamic Huffman coding produces a dataset that is larger can be found in Shmuel T. Klein, Shoham Saadia, and Dana Shapira. *Forward looking Huffman coding. In The* 14*th Computer Science Symposium in Russia, CSR*, Novosibirsk, Russia, Jul. 1-5, 2019 (hereinafter "Klein").

An encoding process described herein, in particular with reference to FIG. 1B, sometimes referred to as forward looking coding (or FORWARD), starts with the full frequencies (e.g., which may be computed using the process described with reference to the standard Huffman static variant), and then decreases the frequencies progressively. After each processed data element denoted σ, the model is altered by decrementing the frequency of σ by 1, while the other frequencies remain the same. As described herein, the forward looking coding process (e.g., Huffman based) has been shown to be always better by at least m−1 bits than static Huffman coding. It is noted that the encoding described with reference to FIG. 1B may be implemented using other encoding processes. The Huffman based approach is a not necessarily limiting example.

Figure 1B:
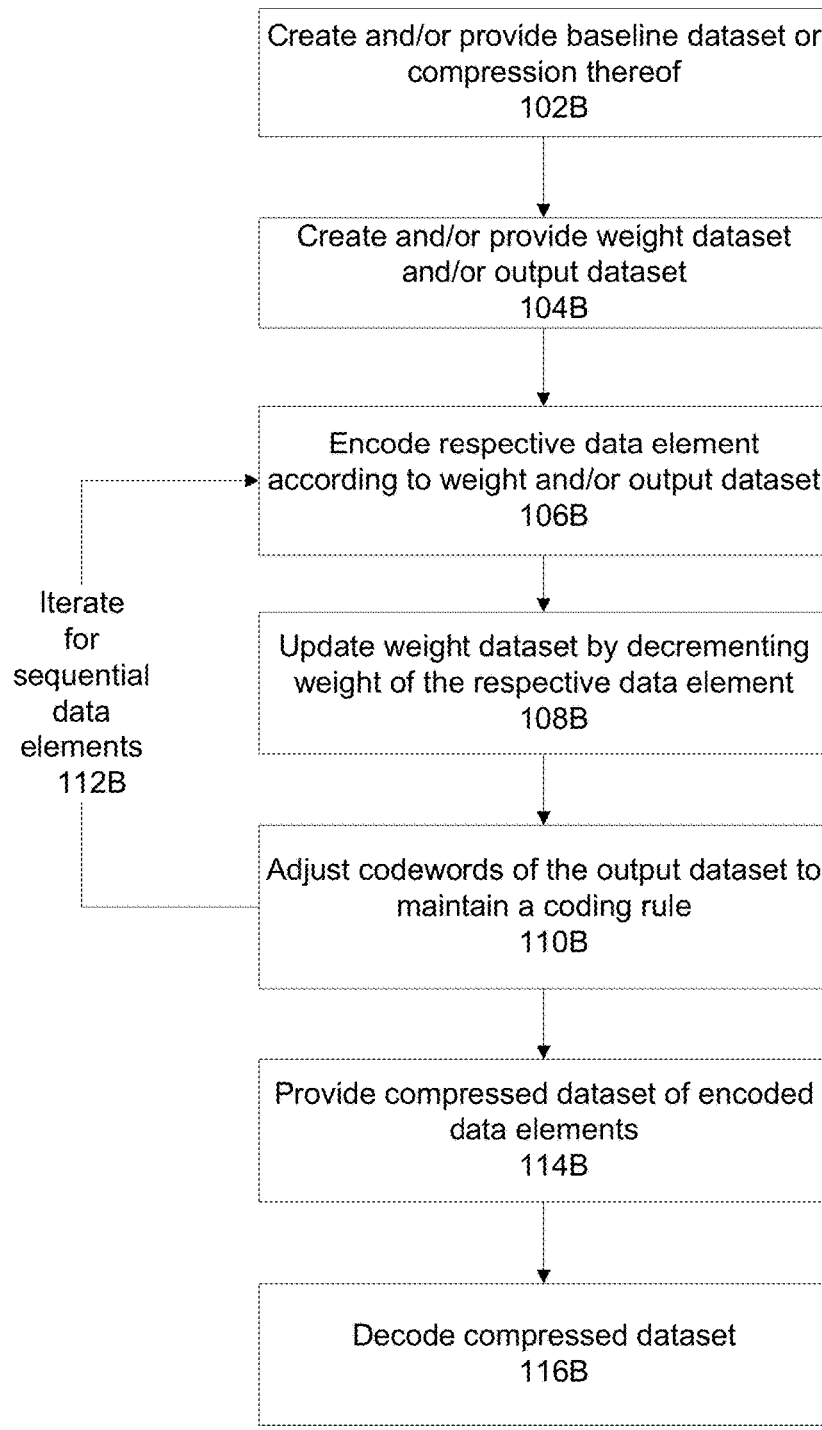
FIG. 1B is a flowchart of a method of compressing a baseline dataset according to a weight dataset storing weights for data elements for the non-encoded portion of the baseline dataset and/or according to an output dataset storing a mapping between data elements and codewords, in accordance with some embodiments of the present invention.

The traditional dynamic Huffman coding is sometimes referred to herein as "backward looking", because its model is based on what has already been seen in the past, in contrast to the forward looking encoding described herein, in particular with reference to FIG. 1B that constructs the model based on what is still to come in the future.

A hybrid method, exploiting both backward and forward approaches is proposed in Aharon Fruchtman, Shmuel T. Klein, and Dana Shapira. *Bidirectional adaptive compression. In Proceedings of the Prague Stringology Conference* 2019, pages 92-101, 2019, and has been shown to be always at least as good as the forward looking coding (e.g., based on Huffman coding).

At least some implementations of the systems, methods, apparatus, and/or code instructions described herein operate differently than other Huffman coding approaches. For example:

Standard static Huffman approaches encode a character (i.e., data element) denoted σ by the same codeword denoted E(σ), regardless of where in the text σ occurs, i.e., independently of sequential location of the respective data element in the dataset. The choice of how many bits to allocate to E(σ) is therefore governed solely by the frequency of σ in the dataset denoted T, and not by where in T the occurrences of a are be found. In contrast, at least some implementations of the systems, methods, apparatus, and/or code instructions described herein determine encodings of data elements of a dataset according to weights computed based on a weight function that calculates a weight for each one of the instances of each one of the unique data elements in the baseline dataset, as a function of sequential locations of each of the instances of each respective unique data element within the baseline dataset.

In the adaptive Huffman coding approach, the set of frequencies in the entire dataset denoted T are yet unknown after only a prefix of size i−1 has been processed, for i≤n. Basing the encoding on the currently known statistics is thus just an estimate, and a good compression performance of this approach depends on whether or not the distribution of the data elements derived from the processed prefix is similar to the distribution in the entire dataset.

The compression processes implemented by at least some of the systems, methods, apparatus, and/or code instructions described herein are based on an alternative approach to traditional coding approaches, such as static Huffman and adaptive Huffman, which are based on known frequencies of the data elements and/or estimated frequencies of the data elements. Inventors discovered that a greedy approach, where data elements that are closer to a reference location (e.g., current sequential position, and/or first position) in the dataset are assigned higher weights than data elements that are further away, provide an improvement in compression performance over existing standard approaches such as static and adaptive Huffman encodings. The sequentially close by data elements are those that are about to be encoded, and when the lengths of the codewords of the close by data elements are reduced, even at the price of having to lengthen the codewords of more distant data elements in the dataset, overall compression is improved, since, anyway, the encoding of the more distant data elements will be reconsidered by the adaptive process once the location of encoding becomes closer to them.

The compression processes implemented by at least some of the systems, methods, apparatus, and/or code instructions described herein, which are based on assigning weight according to sequential position within the dataset (e.g., higher weights for data elements relatively closer to the start of the dataset) is different than other processes. For example, in Ziv-Lempel coding as described with reference to James A. Storer and Thomas G. Szymanski. *Data compression via textual substitution. J. ACM,* 29(4):928-951, 1982, a sliding window of limited size is selected. In another example, accumulated frequencies are periodically rescaled in adaptive (backward) Huffman or arithmetic coding as described with reference to Mark Nelson and Jean-Loup Gailly. *The Data Compression Book,* 2*nd Edition.* M & T Books, 1996.

A mathematical analysis that provides evidence that compression using at least some implementations of the systems, methods, apparatus, and/or code instructions described herein with reference to FIG. 1A (denoted POSITIONAL) is at least as good as compression using the systems, methods, apparatus, and/or code instructions described herein, in particular with reference to FIG. 1B (denoted FORWARD) is provided below.

An aspect of some embodiments of the present invention relates to systems, methods, an apparatus, and/or code instructions (i.e., stored in a data storage device, executable by one or more hardware processors) for compressing a baseline dataset based on the data elements in the remaining portion of the baseline data (i.e., not yet encoded, scheduled for future encoding). The baseline dataset includes a sequence of data elements, for example, a file of text, where the data elements are defined as individual characters, or where the data elements are defined as words, and/or symbols (e.g., text and/or non-text) where the symbols may be defined as individual symbols and/or sets of two or more symbols (e.g., strings). The data elements, each one of which appears one or more times in the baseline dataset, are defined by a set, for example, an alphabet and/or set of symbols and/or set of charades. An initial output dataset stores a codeword for converting each data elements to an encoded data element is defined. An initial weight dataset storing a weight of each one of the data elements is defined. The output dataset and weight dataset may be defined by a single data structure such as a binary tree, optionally a Huffman tree, and/or each individually, for example, as separate tables. The weight is computed for the whole baseline dataset prior to compression, for example, using static Huffman processes. The respective weight for a certain data element may be indicative of frequency of the respective data element within the baseline dataset, optionally a frequency and/or other indication of a number of occurrences in the baseline dataset. The codewords are according to a compression rule. The compression rule defines that data elements associated with a relatively higher weight are associated with codewords that are relatively shorter in comparison to data elements associated with relatively lower weight. In other words, the more frequent the occurrence of a certain data element, the shorter its codeword. The shorter codewords for more frequently occurring data elements are selected to produce an overall compression of the baseline dataset. The compressed dataset is dynamically created by sequentially computing an encoded data element mapped to each respective data element of the baseline dataset, according to the output dataset and/or weight dataset. At each iteration (i.e., each encoded data element), the weight dataset is updated by decrementing the weight of the respective data element. The value stored by the weight dataset represents the weight (e.g., frequency, number of occurrences) for the remaining not yet coded portion of the baseline dataset. The codewords of the output dataset are adjusted for the updated output dataset to maintain the compression rule. The encoded elements are arranged into the compressed dataset, where the storage size of the compressed dataset is smaller than the storage size of the non-compressed baseline dataset.

As used herein, the terms weights and frequency may sometimes be interchanged, when both denote an indication of the amount and/or occurrences of a certain data element.

At least some implementations of the systems, methods, apparatus, and/or code instructions (i.e., stored in a data storage device and executable by one or more hardware processors) improve the field of data compression, in particular, improve upon the data compression process based on static and/or dynamic Huffman encoding. The improvement in data compression improves performance of a data storage device and/or network, by requiring fewer data storage resources for storage of the compressed dataset and/or requiring fewer network resources for transmission of the compressed dataset (e.g., smaller bandwidth), in comparison to a dataset compressed using static and/or dynamic Huffman encoding processes.

Huffman coding is one of the cornerstones of data compression processes, and enjoys popularity in spite of almost seven decades since its invention, probably because of its well-known optimality. Given is a text denoted $T=x_1 \cdots x_n$ over some alphabet (also referred to herein as data elements) denoted $\Sigma=\{\sigma_1, \ldots, \sigma_m\}$ such that $\sigma_i$ occurs $w_i$ times in T. The problem is to assign binary codewords of lengths $l_i$ bits to the characters $\sigma_i$, (also referred to herein as data elements) such that the set of codewords forms a prefix code and such that the total size of the encoded dataset in bits, $\Sigma_{i=1}^{m} w_i l_i$, is minimized.

The alphabet (i.e., set of data elements) may include a set of characters, for example, the basic ASCII set of 128 or 256 letters. However it is noted that other data elements may be used, for example, larger sets, such a bigrams, k-grams or even words, and ultimately, any set denoted S of substrings of the text, as long as there is a well defined way to parse the text into a sequence of elements of S.

Huffman's seminal paper, as described with reference to David Huffman, "*A method for the construction of minimum redundancy codes,*" *Proc. of the IRE*, vol. 40, pp. 1098-1101, 1952 solves this problem optimally, but it is noted that Huffman codewords are optimal under the following constraints:

1. The set of data elements (e.g., alphabet) denoted $\Sigma$ is given and fixed in advance.
2. The codeword lengths $l_i$ are integers.

In particular, the second condition seems self-evident when one considers the binary codewords of known codes like ASCII, Huffman, Shanon-Fano or others, though it may be circumvented by arithmetic coding, for example, as described with reference to Ian H. Witten, Radford M. Neal, and John G. Cleary, "*Arithmetic coding for data compression,*" *Commun. ACM*, vol. 30, no. 6, pp. 520-540, 1987. By encoding the entire input baseline dataset as a single element rather than each data element individually, an arithmetic encoder effectively assigns to each occurrence of the data element $\sigma_i$ of probability $p_i=w_i/n$ an encoding of exactly $-\log_2 p_i$ bits, without rounding. The average codeword length thus reaches entropy and is always at least as good as that of Huffman coding based on the same alphabet.

There is, however, another implicit constraint:

3. The encoding is static, i.e., the same codeword is used for a given data element (e.g., character) throughout the encoding process.

Data compression algorithms are often classified into static or adaptive techniques. The static ones base the coding procedures on a weight dataset of the distribution of the encoded elements that is either assumed in advance or gathered in a first pass over the data, whereas the adaptive methods learn the weight dataset details incrementally. Therefore, the static computed weight dataset would seem to be better and produce smaller encoding of the baseline dataset. However, in practice, adaptive compression is sometimes better, in particular when there is much variability in the occurrence patterns of the different data elements on which the weight dataset is based. Furthermore, if the weight dataset is not learned adaptively, a prelude consisting of the details of the chosen weight dataset should be prepended to the compressed dataset, allowing the decoder to be synchronized with the encoder. For the adaptive methods, transmitting the details of the weight dataset to the decoder is superfluous, as the weight dataset gets updated identically on both encoder and decoder ends. The adaptive methods are often referred to as dynamic ones. As used herein, the terms adaptive and dynamic are sometimes interchanged.

In the adaptive mode of Huffman coding, the encoder and decoder maintain identical copies of a varying Huffman tree, which, at each point, corresponds to the frequencies of the elements processed so far. The trivial solution of reconstructing the Huffman tree from scratch after each processed character, is very wasteful, since in most cases, the Huffman tree is not altered: only one of the frequencies is incremented by 1, and the others remain unchanged. This motivated the development of efficient adaptive Huffman coding procedures, for example, as described with reference to Newton Faller, "*An adaptive system for data compression,*" in *Record of the* 1*-th Asilomar Conference on Circuits, Systems and Computers,* 1973, pp. 593-597 and Robert Gallager, "*Variations on a theme by Huffman,*" *IEEE Transactions on Information Theory*, vol. 24, no. 6, pp. 668-674, 1978, who propose essentially the same one-pass solution. Knuth extends Gallager's work and also suggests that the frequencies may be decreased as well as increased Donald E Knuth, "*Dynamic Huffman coding,*" *Journal of Algorithms*, vol. 6, no. 2, pp. 163-180, 1985. These independent adaptive Huffman coding methods are known as the FGK algorithm.

A further enhancement by Vitter Jeffrey S. Vitter, "*Design and analysis of dynamic Huffman codes,*" *J. ACM*, vol. 34, no. 4, pp. 825-845, 1987 also minimizes the external path length $\Sigma_{i=1}^{m} l_i$ and the height max $\{l_i\}$ among all Huffman trees. Vitter proved that the number of bits used in the adaptive Huffman procedure in order to encode a message of n characters, is bounded by the size of the compressed baseline dataset resulting from the optimal two-pass static Huffman algorithm, plus n. That is, the dynamically produced compressed dataset may be larger than the static counterpart, and examples may be given for which this actually happens, though empirical results often show that on the contrary, there might be an improvement in the compression rate of the dynamic version as compared to the static one. One may thus conclude that in certain cases, though not in all, adaptive Huffman coding is better than the optimal static Huffman coding.

The traditional dynamic Huffman coding, and in fact, practically all adaptive compression processes, update the weight dataset according to what has already been seen in the baseline dataset processed so far. The underlying assumption is that the past is a good approximation of the future. More precisely, the distribution of the data elements in the prefix of the baseline dataset up to the current point, serves as an estimate for the distribution of these elements from the current point onwards. Such an assumption seems to be justifiable, especially for homogeneous texts written in some natural language, but there is of course no guarantee that it holds for all possible input baseline datasets. In contrast to the traditional dynamic Huffman processes, which base their current weight dataset (i.e., the state of the Huffman tree, which is used to encode data elements) on what has already been seen in the past, the compression method described herein, implemented by at least some implementations of the systems, methods, apparatus, and/or code instructions herein, is based on using the weight dataset's values indicating what is still to come, i.e., it looks to the future.

At least some implementations of the systems, methods, apparatus, and/or code instructions described herein compress a dataset that performs at least as good as static Huffman coding, and in some cases, better than the traditional dynamic Huffman coding. It is noted that in practice, the traditional dynamic Huffman coding may perform worse than the static Huffman coding, while in contrast, compression performance obtained by at least some implementations of the systems, methods, apparatus, and/or code instructions described herein is better than static Huffman, most likely on all types of datasets. No cases have been found by Inventors in which the static Huffman performs better, see for example, the "Examples" section below. It is noted that as discussed below in the "Examples" section, for some datasets, the traditional Huffman dynamic encoding process may outperform at least some implementations of the systems, methods, apparatus, and/or code instructions described herein. However as discussed below in the "Examples" section, for other datasets, for example, executables and for large alphabets, and/or when the precise number of occurrences is already known to the decoder such as in Information Retrieval applications, at least some implementations of the systems, methods, apparatus, and/or code instructions described herein outperformed the traditional dynamic Huffman coding process.

The following is a mathematical theorem that provides evidence that compression using at least some implementations of the systems, methods, apparatus, and/or code instructions described herein is at least as good as compression using a standard static Huffman approach.

Theorem: For a given distribution of frequencies (also referred to herein as weights, or number of occurrences), the average codeword length of the compression process using at least some implementations of the systems, methods, apparatus, and/or code instructions described herein is at least as good as the average codeword length of static Huffman coding.

Proof: The non-encoded baseline dataset has a number of characters denoted n and the situation is inspected after a number of characters denoted t have already been encoded according to the static Huffman code. If $t=n$, the encoding is identical to static Huffman coding. For $t<n$, if the distribution of the characters in the first t characters is known, a Huffman code should have been created just for these t characters, but lacking this knowledge, the global weights (e.g., frequencies) were obtained and encoded accordingly. However, for the following n-t characters, the true distribution is known, which might be different from the global one, so continuing with the static global distribution, one can only be worse (or at least not better) than changing to another Huffman code according to the frequencies in the last n-t characters, which is what is done in the encoding process implemented by at least some of the systems, apparatus, methods, and/or code instructions described herein. The overall sum of the codeword lengths for the static encoding is thus larger or equal to the sum of the codeword lengths of the first/characters, plus the sum of the codeword lengths of the static Huffman encoding based only on the weighs (e.g., frequencies) of the last n-t characters. But the same argument applies on this static encoding of the last n-t characters, thus repeating the argument and choosing $t=1$ gives that the expected codeword length of a static Huffman code is larger than or equal to the expected codeword length of the encoding process implemented by at least some of the systems, apparatus, methods, and/or code instructions described herein.

The compression processes implemented by at least some of the systems, methods, apparatus, and/or code instructions described herein is a different approach to what one skilled in the art would do in order to produce a more economical encoding using traditional dynamic Huffman encoding processes. Traditional dynamic Huffman coding concentrates only on the character (or other data element) that is currently processed: the frequency associated with the current data element is incremented, which tends to shorten the codeword length for future usage. However, Inventors discovered this approach ignores the fact that these future savings may come at the price of other codewords being lengthened. This "selfish" behavior is counterbalanced by the more altruistic approach of the compression process described herein, where the frequency of the currently processed data element is decreased, even though, as a consequence, the corresponding codeword consequently becomes longer. Inventors discovered that the counter-intuitive implementation of decreasing the frequency (or other weight and/or incidence count) of the data element may actually shorten the codewords of other encoding symbols that are still present in the tree, yielding an overall gain, even when resulting in a longer encoding symbol (and therefore loss) for the data element.

At least some implementations of the systems, methods, apparatus, and/or code instructions described herein operate differently than other Huffman coding approaches. For example:

Adaptive Huffman coding may reserve leaves in the Huffman tree only to characters that have already been processed, plus one leaf, often called NYT for Not Yet Transmitted, to enable the extension of the alphabet whenever a character (denoted c) that has not been seen previously is encountered. In such case, the codeword of NYT is sent to the output, followed by some standard encoding of c, e.g., in ASCII (though this limits the size of the alphabet to 256, which is often not enough, for example when encoding words rather than single letters). The leaf for NYT is then split, i.e., transformed into a node with two leaf children, one for c and one for NYT. In contrast, at least some implementations of the systems, methods, apparatus, and/or code instructions described herein provide the set of data element types (e.g., alphabet) in advance of the encoding to the encoder, and/or in advance of the decoding to the decoder.

For the classical dynamic Huffman coding, all nodes are assigned a frequency of 0 (or all 1 if zero frequencies may cause trouble), and the frequencies are incremented at each step. The Huffman tree at the end is one that would have been produced by static Huffman coding. In contrast, at least some implementations of the systems, methods, apparatus, and/or code instructions described herein set the initial frequencies of the data elements to the frequencies corresponding to the entire baseline dataset (e.g., file). The frequencies are decremented after the processing of each data element (e.g., character). When one of the frequencies reaches 0, it is indicative that no further occurrences of the corresponding data element are expected to occur. The entry (e.g., leaf) may be removed from the weight dataset (e.g., tree).

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 2A:
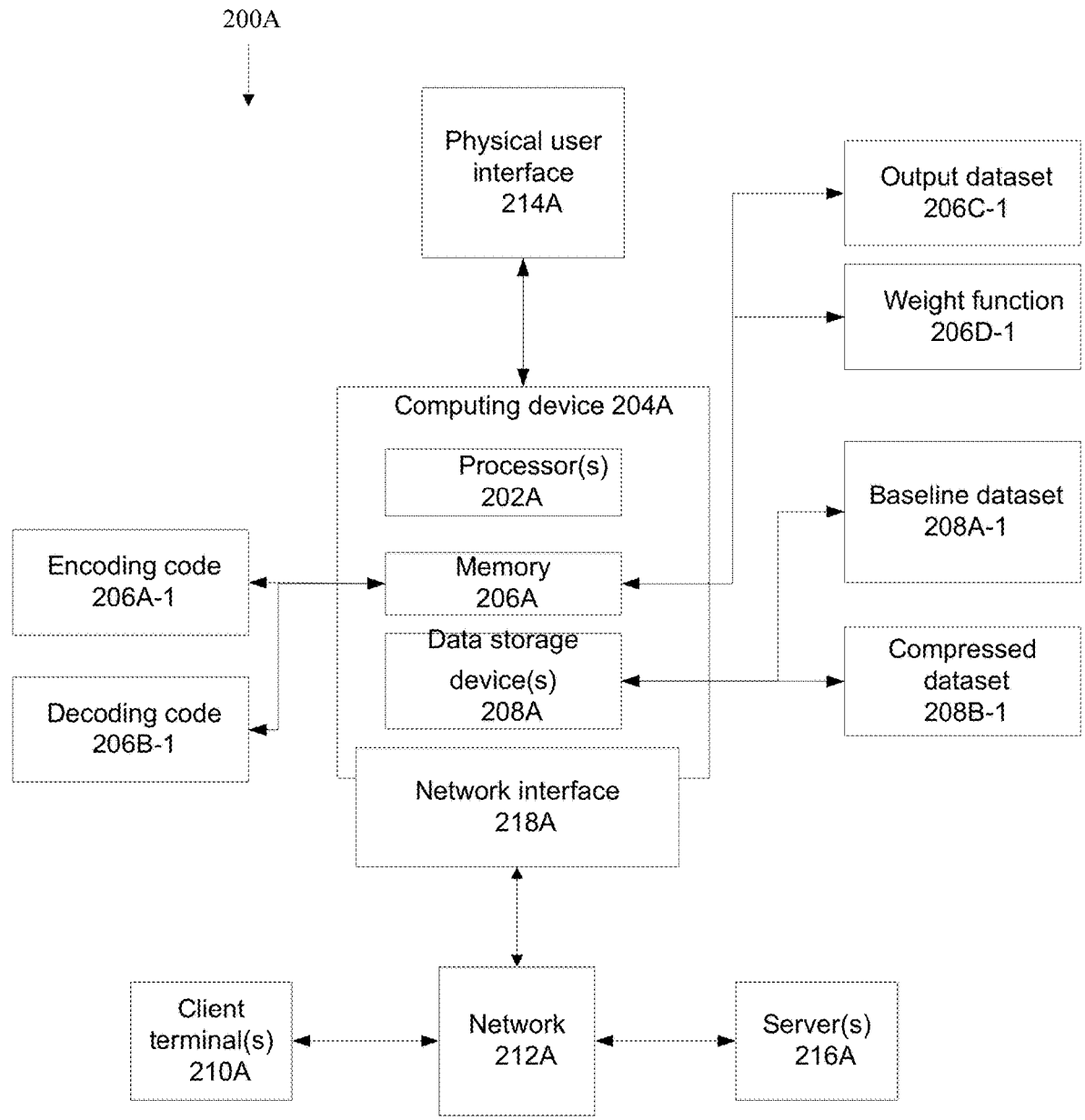
FIG. 2A is a block diagram of components of a system for compressing a baseline dataset according to a weight function that calculates a weight for each one of the instances of each one of the unique data elements in the baseline dataset, as a function of sequential locations of each of the instances of each respective unique data element within the baseline dataset, and/or according to an output dataset that maps data elements to codewords, in accordance with some embodiments of the present invention.
Figure 2B:
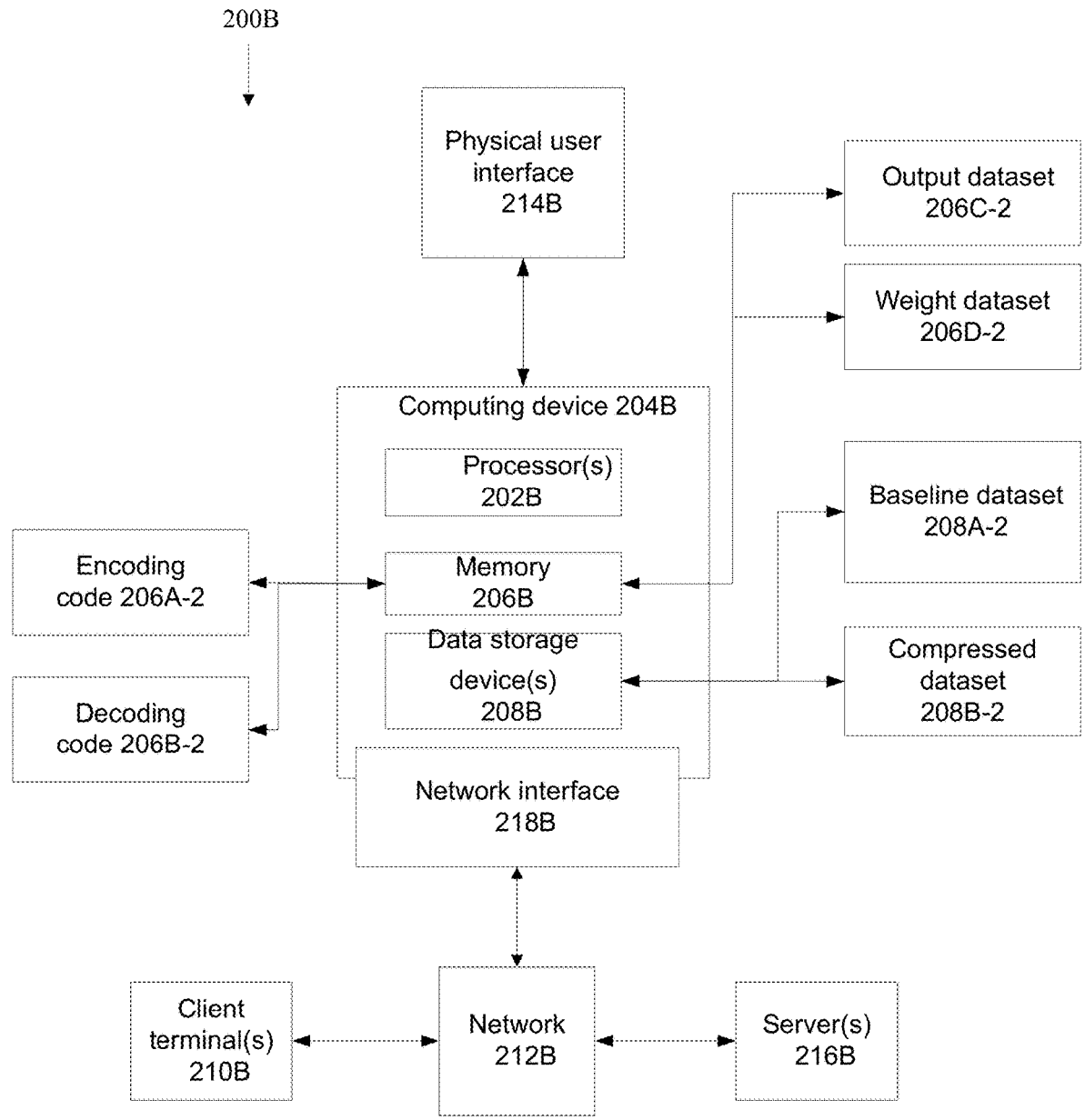
FIG. 2B is a block diagram of components of a system for compressing a baseline dataset according to a weight dataset storing weights for data elements for the non-encoded portion of the baseline dataset, and/or according to an output dataset that maps data elements to codewords, in accordance with some embodiments of the present invention.

Reference is now made to FIG. 1A, which is a flowchart of a method of compressing a baseline dataset according to weights of each one of the unique data elements in the baseline dataset based on sequential positions of instances of the respective unique data elements within the baseline dataset, in accordance with some embodiments of the present invention. Reference is also made to FIG. 1B, which is a flowchart of a method of compressing a baseline dataset according to a weight dataset storing weights for data elements for the non-encoded portion of the baseline dataset and/or according to an output dataset storing a mapping between data elements and codewords, in accordance with some embodiments of the present invention. The non-encoded portion represents the portion of the baseline dataset that is scheduled for encoding but has not yet been encoded. Reference is also made to FIG. 2A, which is a block diagram of components of a system 200A for compressing a baseline dataset according to a weight function 206D-1 that calculates a weight for each one of the instances of each one of the unique data elements in the baseline dataset, as a function of sequential locations of each of the instances of each respective unique data element within the baseline dataset, and/or according to an output dataset 206C-1 that maps data elements to codewords, in accordance with some embodiments of the present invention. Reference is also made to FIG. 2B, which is a block diagram of components of a system 200B for compressing a baseline dataset according to a weight dataset 206D-2 storing weights for data elements for the non-encoded portion of the baseline dataset, and/or according to an output dataset 206C-2 that maps data elements to codewords, in accordance with some embodiments of the present invention. System 200A may implement the acts of the method described with reference to FIG. 1A, by processor(s) 202A of a computing device 204A executing code instructions (e.g., code 206A-1) stored in a memory 206A (also referred to as a program store). System 200B may implement the acts of the method described with reference to FIGS. 1A-1B, by processor(s) 202B of a computing device 204B executing code instructions (e.g., code 206A-2) stored in a memory 206B (also referred to as a program store). Is it is noted that system 200A described with reference to FIG. 2A and system 200B described with reference to FIG. 2B may be integrated into a single system with the capability of compressing data according to the method described with reference to FIG. 1A and/or according to the method described with reference to FIG. 1B, for example, according to user selection and/or automated selection by code (e.g., which analyzes which compression is most optimal and/or suitable for the implementation scenario).

Referring now back to FIG. 2A, computing device 204A may be implemented as, for example one or more and/or combination of: a group of connected devices, a client terminal, a server, a virtual server, a computing cloud, a virtual machine, a sensor, a camera, a cellular phone, a desktop computer, a thin client, a network node, a network server, and/or a mobile device (e.g., a Smartphone, a Tablet computer, a laptop computer, a wearable computer, glasses computer, and a watch computer).

Different architectures of system 200A may be implemented, for example:

Computing device 204A may be implemented as one or more servers (e.g., network server, web server, a computing cloud, a virtual server, a network node) that provides services to multiple client terminals 210A over a network 212A, for example, software as a service (SaaS), free compression and/or decompressing services, and/or other remote services.

Communication between client terminal(s) 210A and computing device 204A over network 212A may be implemented, for example, via an application programming interface (API), software development kit (SDK), functions and/or libraries and/or add-ons added to existing applications executing on client terminal(s), an application for download and execution on client terminal 210A that communicates with computing device 204A, function and/or interface calls to code executed by computing device 204A, a remote access section executing on a web site hosted by computing device 204A accessed via a web browser executing on client terminal(s) 210A, client terminal(s) 210A may be implemented as thin clients and/or slaves and/or users of computing device 204A, for example, sensors that sense large amount of data and transmit the data to computing device for compression thereof.

In another example, client terminal 210A provides the baseline dataset to computing device 204A, and receive back the compressed dataset. In yet another example, client terminal 210A provides the baseline dataset to computing device 204A, and computing device 204A stores the compressed dataset, and/or provides the compressed dataset to another server. In yet another example, the baseline dataset is already stored on computing device 204A, and/or obtained from another server, and the compressed dataset is stored on computing device 204A and/or provide to client terminal 210A.

Computing device 204A may be implemented as a standalone device (e.g., client terminal, smartphone, smart television, computing cloud, virtual machine, kiosk, sensor) that includes locally stored code that implement one or more of the acts described with reference to FIG. 1A. For example, computing device 204A may be implemented as a sensor that senses data (i.e., baseline dataset) and compresses the sensed data to compute the compressed dataset. In another example, computing device 204A may be implemented as a cellular phone that compressed speech for transmission over the wireless and/or cellular network to another phone. In another example, computing device 204A may be implemented as a data storage server that receives data, and compresses the data for storage. In yet another example, computing device 204A may be implemented as a camera that captures an images and compresses the image.

Hardware processor(s) 202A of computing device 204A may be implemented, for example, as a central processing unit(s) (CPU), a graphics processing unit(s) (GPU), field programmable gate array(s) (FPGA), digital signal processor(s) (DSP), and application specific integrated circuit(s) (ASIC). Processor(s) 202A may include a single processor, or multiple processors (homogenous or heterogeneous) arranged for parallel processing, as clusters and/or as one or more multi core processing devices.

Memory 206A stores code instructions executable by hardware processor(s) 202A, for example, a random access memory (RAM), read-only memory (ROM), and/or a storage device, for example, non-volatile memory, magnetic media, semiconductor memory devices, hard drive, removable storage, and optical media (e.g., DVD, CD-ROM). Memory 206A stores code 206A-1 and/or code 206B-1 that implements one or more features and/or acts of the method described with reference to FIG. 1A when executed by hardware processor(s) 202A. Memory 206A may store encoding code 206A-1 that compressed the baseline dataset into the compressed dataset, and/or decoding code 206B-1 that de-compresses the compressed dataset into the baseline dataset, and/or output dataset 206C-1 that stores a mapping between data elements and codewords, and/or a weight function 206D-1 that calculates a weight for each one of the instances of each one of the unique data elements in the baseline dataset, as a function of sequential locations of each of the instances of each respective unique data element within the baseline dataset, as described herein.

It is noted that encoding code 206A-1 and/or decoding code 206B-1 may be stored on client terminal 210A and/or server 216A and/or computing device 204A and/or other devices (not shown).

Computing device 204A may include data storage device(s) 208A for storing data, for example, baseline dataset 208A-1 (i.e., data for compression) and/or compressed dataset 208B-1 (i.e., baseline dataset after compression). Data storage device(s) 208A may be implemented as, for example, a memory, a local hard-drive, virtual storage, a removable storage unit, an optical disk, a storage device, and/or as a remote server and/or computing cloud (e.g., accessed using a network connection).

It is noted that baseline dataset 208A-1 and/or compressed dataset 208B-1 may be stored on client terminal 210A and/or server 216A and/or computing device 204A and/or other devices (not shown).

Network 212A may be implemented as, for example, the internet, a broadcast network, a local area network, a virtual network, a wireless network, a cellular network, a local bus, a point to point link (e.g., wired), and/or combinations of the aforementioned.

Computing device 204A may include a network interface 218A for connecting to network 212A, for example, one or more of, a network interface card, an antenna, a wireless interface to connect to a wireless network, a physical interface for connecting to a cable for network connectivity, a virtual interface implemented in software, network communication software providing higher layers of network connectivity, and/or other implementations.

Computing device 204A and/or client terminal(s) 210A include and/or are in communication with one or more physical user interfaces 214A that include a mechanism for user interaction, for example, to enter data (e.g., select the baseline dataset for compression thereof, select and/or define the weight function) and/or to view data (e.g., view the decompressed data).

Exemplary physical user interfaces 214A include, for example, one or more of, a touchscreen, a display, gesture activation devices, a keyboard, a mouse, and voice activated software using speakers and microphone.

Computing device 204A may communicate with one or more of the following over network 212A:
Client terminal(s) 210A, for implementing the different architectures described herein.
Server(s) 216A, for implementing the different architectures described herein.

Client terminal(s) 210A and/or server(s) 216A may be implemented as, for example, as a desktop computer, a server, a sensor, a camera, a virtual server, a network server, a web server, a virtual machine, a thin client, a cellular telephone, a smart phone, and a mobile device.

Computing device 204B may be implemented as, for example one or more and/or combination of: a group of connected devices, a client terminal, a server, a virtual server, a computing cloud, a virtual machine, a sensor, a camera, a cellular phone, a desktop computer, a thin client, a network node, a network server, and/or a mobile device (e.g., a Smartphone, a Tablet computer, a laptop computer, a wearable computer, glasses computer, and a watch computer).

Different architectures of system 200B may be implemented, for example:
Computing device 204B may be implemented as one or more servers (e.g., network server, web server, a computing cloud, a virtual server, a network node) that provides services to multiple client terminals 210B over a network 212B, for example, software as a service (SaaS), free compression and/or decompressing services, and/or other remote services.

Communication between client terminal(s) 210B and computing device 204B over network 212B may be implemented, for example, via an application programming interface (API), software development kit (SDK), functions and/or libraries and/or add-ons added to existing applications executing on client terminal(s), an application for download and execution on client terminal 210B that communicates with computing device 204B, function and/or interface calls to code executed by computing device 204B, a remote access section executing on a web site hosted by computing device 204B accessed via a web browser executing on client terminal(s) 210B, client terminal(s) 210B may be implemented as thin clients and/or slaves and/or users of computing device 204B, for example, sensors that sense large amount of data and transmit the data to computing device for compression thereof.

In another example, client terminal 210B provides the baseline dataset to computing device 204B, and receive back the compressed dataset. In yet another example, client terminals 210B provides the baseline dataset to computing device 204B, and computing device 204B stores the compressed dataset, and/or provides the compressed dataset to another server. In yet another example, the baseline dataset is already stored on computing device 204B, and/or obtained from another server, and the compressed dataset is stored on computing device 204B and/or provide to client terminal 210B.

Computing device 204B may be implemented as a standalone device (e.g., client terminal, smartphone, smart television, computing cloud, virtual machine, kiosk, sensor) that includes locally stored code that implement one or more of the acts described with reference to FIG. 1B. For example, computing device 204B may be implemented as a sensor that senses data (i.e., baseline dataset) and compresses the sensed data to compute the compressed dataset. In another example, computing device 204B may be implemented as a cellular phone that compressed speech for transmission over the wireless and/or cellular network to another phone. In another example, computing device 204B may be implemented as a data storage server that receives data, and compresses the data for storage. In yet another example, computing device 204B may be implemented as a camera that captures an images and compresses the image.

Hardware processor(s) 202B of computing device 204B may be implemented, for example, as a central processing unit(s) (CPU), a graphics processing unit(s) (GPU), field programmable gate array(s) (FPGA), digital signal processor(s) (DSP), and application specific integrated circuit(s) (ASIC). Processor(s) 202B may include a single processor, or multiple processors (homogenous or heterogeneous) arranged for parallel processing, as clusters and/or as one or more multi core processing devices.

Memory 206B stores code instructions executable by hardware processor(s) 202B, for example, a random access memory (RAM), read-only memory (ROM), and/or a storage device, for example, non-volatile memory, magnetic media, semiconductor memory devices, hard drive, removable storage, and optical media (e.g., DVD, CD-ROM). Memory 206B stores code 206A-2 and/or code 206B-2 that implements one or more features and/or acts of the method described with reference to FIG. 1B when executed by hardware processor(s) 202B. Memory 206B may store encoding code 206A-2 that compressed the baseline dataset into the compressed dataset, and/or decoding code 206B-2 that de-compresses the compressed dataset into the baseline dataset, and/or output dataset 206C-2 that stores a mapping between data elements and codewords, and/or weight dataset 206D-2 that stores weights of data elements for the not yet encoded portion of the baseline dataset, maps between non-coded data elements and encoded data elements, and is adjusted to maintain the compression rule, as described herein.

It is noted that encoding code 206A-2 and/or decoding code 206B-2 may be stored on client terminal 210B and/or server 216B and/or computing device 204B and/or other devices (not shown).

Computing device 204B may include data storage device(s) 208B for storing data, for example, baseline dataset 208A-2 (i.e., data for compression) and/or compressed dataset 208B-2 (i.e., baseline dataset after compression). Data storage device(s) 208B may be implemented as, for example, a memory, a local hard-drive, virtual storage, a removable storage unit, an optical disk, a storage device, and/or as a remote server and/or computing cloud (e.g., accessed using a network connection).

It is noted that baseline dataset 208A-2 and/or compressed dataset 208B-2 may be stored on client terminal 210B and/or server 216B and/or computing device 204B and/or other devices (not shown).

Network 212B may be implemented as, for example, the internet, a broadcast network, a local area network, a virtual network, a wireless network, a cellular network, a local bus, a point to point link (e.g., wired), and/or combinations of the aforementioned.

Computing device 204B may include a network interface 218B for connecting to network 212B, for example, one or more of, a network interface card, an antenna, a wireless interface to connect to a wireless network, a physical interface for connecting to a cable for network connectivity, a virtual interface implemented in software, network communication software providing higher layers of network connectivity, and/or other implementations.

Computing device 204B and/or client terminal(s) 210B include and/or are in communication with one or more physical user interfaces 214B that include a mechanism for user interaction, for example, to enter data (e.g., select the baseline dataset for compression thereof) and/or to view data (e.g., view the decompressed data).

Exemplary physical user interfaces 214B include, for example, one or more of, a touchscreen, a display, gesture activation devices, a keyboard, a mouse, and voice activated software using speakers and microphone.

Computing device 204B may communicate with one or more of the following over network 212B:

Client terminal(s) 210B, for implementing the different architectures described herein.

Server(s) 216B, for implementing the different architectures described herein.

Client terminal(s) 210B and/or server(s) 216B may be implemented as, for example, as a desktop computer, a server, a sensor, a camera, a virtual server, a network server, a web server, a virtual machine, a thin client, a cellular telephone, a smart phone, and a mobile device.

Referring now back to FIG. 1A, at 102A, a baseline data is provided and/or created. The baseline dataset is the non-compressed dataset for compression. The baseline dataset may be, for example, manually selected by a user for compression (e.g., using a graphical user interface) and/or automatically selected by code (e.g., code that manages backup data, code that compresses data for transmission over a network).

The baseline dataset includes multiple sequentially arranged data elements. Data elements are re-used, such that each data elements appears multiple times within the baseline dataset. Data elements of the baseline dataset may be defined by a set of unique data elements, for example, an alphabet, text letters, symbols (e.g., non-text, and/or including both text and non-text), text words, words (e.g., non-text words, and/or including both text and non-text words, and/or words including both text and/or non-text symbols). The set of unique data elements (each one of which may be repeated multiple times in the baseline dataset) may sometimes be referred to as an alphabet. The alphabet may include, for example, ASCII characters and/or symbols, EBCDIC characters and/or symbols, UNICODE characters and/or symbols, and letters of a natural language. The alphabet may include elements, each of which is a string of one or more characters, for example, words of a natural language.

Optionally, the entire baseline dataset is available, for example, stored in a data storage device, for example a stored file. Alternatively or additionally, a portion of the baseline dataset is not yet available, for example, does not yet exist, and/or has not yet been received (e.g., not yet transmitted by a remote server), and/or not yet available (e.g., file stored on data storage device is dynamically updated and does not yet include portions of the baseline dataset for encoding). For example, the baseline dataset stores digitized audio recorded during a phone conversation. Such baseline dataset cannot store audio that has not yet been spoken and recorded, although such audio is scheduled for compression. In such a case, the baseline dataset may be dynamically created and encoded, as described herein.

At 104A, a weight function that calculates a weight for each one of the instances of each one of the unique data elements in the baseline dataset, as a function of sequential locations of each of the instances of each respective unique data element within the baseline dataset, is created and/or selected and/or provided. The function calculates the weight relative to a reference location of the baseline dataset. In an exemplary implementation, the relative sequential location is a first sequential position of the baseline dataset. However, it is noted that other relative sequential locations may be implemented, for example, the middle of the baseline dataset, a quarter of data elements of the way into the baseline dataset, the end of the baseline dataset, or other locations.

Optionally, weights computed using the weight function for each of the unique data elements are stored in a weight dataset, optionally implemented as a weight tree and/or table, and/or other data structure. Alternatively or additionally, the weights computed using the weight function are dynamically computed and used to dynamically select encodings, as described herein, in which case the weight dataset is not necessarily used to store the computed weights.

Inventors discovered that assigning relatively higher weights to data elements that are relatively closer to the current location in the baseline dataset being encoded (e.g., and/or relatively closer to the first data element of the baseline dataset) increases compression performance.

In terms of formal mathematical representation, the baseline dataset (e.g., stored as a file) may be denoted as $T=T[1,n]$ of n characters over an alphabet denoted $\Sigma$. Let $g:[1,n] \to \mathbb{R}^+$ denote a non-negative function defined on the integers that assigns a positive real number as a weight to each position denoted $i \in [1,n]$ within T.

Optionally, the weight function is a backward weight function based on backward looking data elements. The weight of a certain instance of a certain data element at a current sequential location (i.e., being processed during the current iteration) is computed as a function (e.g., sum, multiplication, weighted multiplication, other functional implementations) of values of the weight function computed for each instance of the certain data element for previous sequential locations previous to the current sequential location being processed during the current iteration.

Alternatively or additionally, the weight function is a forward weight function, based on forward looking data elements. The weight of a certain instance of a certain data element at a current sequential location (i.e., being processed during the current iteration) is computed as a function (e.g., sum, multiplication, weighted multiplication, other functional implementations) of values of the weight function computed for each instance of the certain data element for subsequent sequential locations following the current sequential location being processed during the current iteration.

Optionally, the value computed by the weight function decreases with increasing sequential locations away from the reference location (e.g., the first sequential location) of the baseline dataset. For example, the weight function may decrease linearly, logarithmically, and/or using other relationships. In an exemplary implementation, each sequential location is indexed with a decreasing integer value from a start of the baseline dataset, representing the number of remaining instances of each one of the unique data elements in the baseline dataset.

In terms of formal mathematic representation, for each data element (e.g., character) denoted $\sigma \in \Sigma$, and each index denoted $i \in [1,n]$, the backward weight is denoted $b_\sigma^g(i)$ and the forward weight is denoted $\sigma \in \Sigma$, for $\sigma$ at index i, according to function denoted g, may be defined, for example, as the sum of the values of g for all positions denoted j<i, respectively j≥i, at which $\sigma$ occurs, denoted $T[j]=\sigma$. In terms of formal mathematical representation, the backward weight may be denoted:

$$b_\sigma^g(i) = \sum_{\{j<i | T[j]=\sigma\}} g(j)$$

and the forward weight may be denoted:

$$f_\sigma^g(i) = \sum_{\{j \geq i | T[j]=\sigma\}} g(j)$$

Optionally, different weights are assigned using a decreasing function (denoted g), for example, a linear decrease. An example of a forward weight based on a linear decreasing function is formally mathematically represented as: $g(i)=n-i+1$ for $1 \leq I \leq n$, where $n=|T|$. The notation that may be used is:

$$p_\sigma(i) = f_\sigma^{n-1+1}(i)$$

It is noted that a mathematical representation based on backward weight may be defined. It is noted that the representation based on forward weight may be based on real frequencies of the respective data elements, while the representation based on backward weights may be based on estimates. The fact that some character has just appeared does not necessarily have an influence on whether the character will appear again and where.

It is noted that other functions may be implemented. For example, an exponentially decreasing function may be used, which may be mathematically represented as $g(i)=2^i$. In such a case, the weight of the following character to be processed will always be the largest, since even when the suffix of the text is of the form abbbbb . . . b, the following relationship hold:

$$f_a^g = 2^{n-i} > \sum_{j=i+1}^{n} 2^{n-j} = f_b^g$$

It follows that the codeword assigned by Huffman's process will be of length 1 bit. Therefore, using the exponentially decreasing function defined above, the text will be encoded by exactly n bits, one bit per character, which means that the bulk of the information is encoded in a header. It is noted that an encoding of such a header is, however, very costly. The weight of each of the characters may be of the order of $2^n$, requiring $\theta(n)$ bits for its encoding, optionally creating a header of size $O(|\Sigma|n)$. Moreover, a process for updating encodings according to weights (e.g., using a tree data structure as described herein) may be very time consuming, having to deal with numbers of unbounded precision. Different functions may be selected and/or found, which yield a good tradeoff between encoding the baseline dataset and the header. The function may be found, for example based on a goal of minimizing the sum of the sizes of the encoding of the baseline dataset and header.

Figure 3:
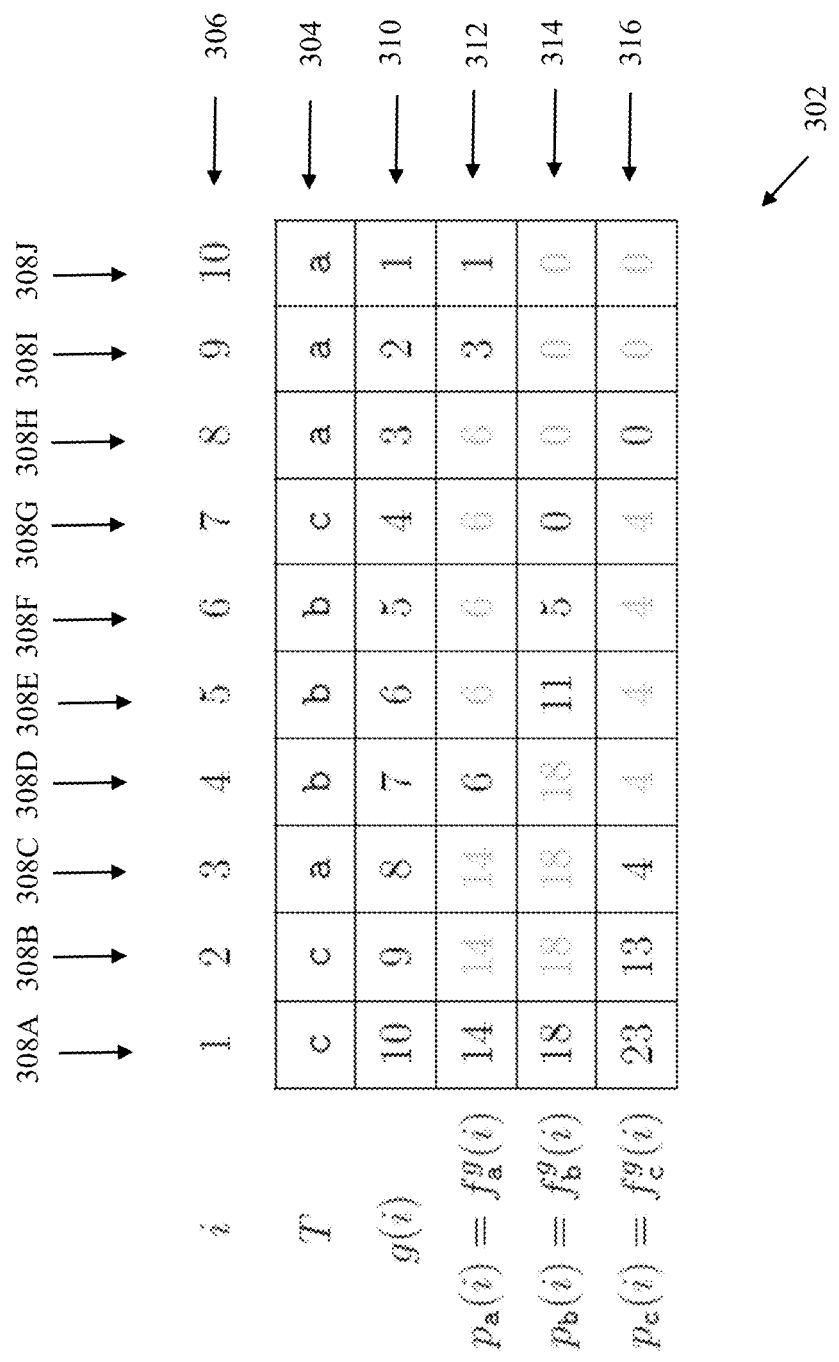
FIG. 3 is a table including a set of exemplary weights computed by the weight function, in accordance with some embodiments of the present invention.

Reference is now made to FIG. 3, which is a table 302 including a set of exemplary weights computed by the weight function, in accordance with some embodiments of the present invention. Table 302 may be stored as a weight dataset. Table 302 is created for baseline dataset denoted T located in row 304. Each one of data elements of baseline dataset T; ccabbbcaa, corresponds to a unique index value denoted i 306. Each of data elements of baseline dataset T; ccabbbcaa, is located in its own cell of a respective column 308A-J of row 304. Row 310 stores value computed using the linearly decreasing forward weight function denoted $g(i)=n-i+1$, where n=10, i.e., the number of instances of all types of data elements in the baseline dataset T. It is noted that row 310 enumerates the indices in reverse order starting from n=10 down to 1. Cells of column 308A-J of rows 312, 314, and 316 store weights computed for the respective data elements "a", "b", and "c" at each index position of the training dataset, using the above discussed equations:

$$f_\sigma^g(i) = \sum_{\{j \geq i | T[j] = \sigma\}} g(j),$$

and $p_\sigma(i) = f_\sigma^{n-i+1}(i)$

For the first index position of the baseline dataset, denoted by i=1 in column 308A, the value of $p_a$ (row 312) is 14, the value of $p_b$ (row 314) is 18, and the value of $p_c$ (row 316) is 23. It is noted that in a scan of table 302, in a direction from 308A to 308J, the values $p_\sigma$ (i.e., $p_a$, $p_b$, and $p_c$) only change at indices i for which $T[i-1]=\sigma$. The following non-changing values are marked in light grey (starting, in a left to right scan, just after an occurrence of σ and ending at the rightmost position where σ occurs in T): for row 312: 308B, 308C, and 308E-H. For row 314: 308B-D, and 308H-J. For row 316: 308D-G and 308I-J.

Alternatively or additionally, an output dataset that stores a mapping between data elements and codewords is created and/or provided. Each one of the data elements in the baseline dataset is mapped to a corresponding codeword for encoding the respective data element.

The weights computed by the weight function and/or output dataset are used to compress the baseline dataset into the compressed dataset, by encoding the data elements of the baseline dataset into corresponding codewords, as described herein.

The output dataset maps each data element which may be defined by a set of data elements, to a single unique codeword. The baseline dataset may include one or more instances of each data element, for example, the set of data elements may be defined as an alphabet, and/or set of symbols and/or set of characters.

The output dataset and values computed by the weight function may be implemented as separate data structures, for example, tables, key-value pairs, pointers, trees, and the like. Each dataset may be managed independently, for example, updated and/or adjusted as described herein. For example, the values computed by the weight function are decreased, and the codewords of the output dataset are adjusted to maintain the compression rule.

Alternatively or additionally, the output dataset and values computed by the weight function are implemented in a common data structure, optionally a single dataset, for example, tables, key-value pairs, pointers, trees, and the like.

Optionally, a weighted tree associated with the values of the weight function computed for each of the data elements, is initialized with the weight function computed for each of the data elements for a first sequential position. The output dataset may be considered as being equivalent to the weighted tree, as two different trees, or as a single tree. Optionally, the coding dataset and/or values of the weight function are implemented as the weighted tree. The weighted tree may include a number of leaves corresponding to a number of the unique data elements. Each leaf node is associated with a certain data element, a certain codeword for encoding the certain data element, and the current weight of the certain data element. Higher up nodes may store a sum of the weights of their children nodes. The root node may store a sum of weights of all data elements, indicative of the number of data elements in the non-encoded portion of the baseline dataset remaining to be encoded.

Optionally, the weighted tree is implemented as a binary tree.

Optionally, the output dataset and/or weight tree are implemented as a Huffman tree. The compression rule may be according to the Huffman tree compression rule.

Optionally, the codewords in the output dataset are arranged according to a compression rule. The compression rule defines that data elements associated with a relatively higher weight are associated with codewords that are relatively shorter in comparison to data elements associated with relatively lower weight. For example, a certain data element with a weight of 15 has a codeword 010, and another data element with a lower weight of 5 has a longer codeword 11000110. In other words, the closer the occurrence(s) of a certain data element to the current location in the baselines dataset that is currently being encoded, the shorter its codeword. The shorter codewords for data elements sequentially located closer to the current location in the baseline dataset being encoded are selected to produce an overall compression of the baseline dataset.

Optionally, an initial state of the weight tree stores weights representing an actual distribution of the data elements in the baseline dataset. The actual distribution may be obtained by processing the entire baseline dataset, for example, counting the number of occurrences of each data element in the baseline dataset.

Alternatively or additionally, the weight of each one of the data elements in the initial baseline dataset stored is computed from one or more other datasets that are estimated to be statistically similar to the baseline dataset and/or are defined from the other dataset. For example, for encoding speech of a phone conversation, the dataset may be of prior phone conversations, for example, between the same two individuals. In another example, for encoding a newspaper article, the dataset may be other newspaper articles, for example, by the same author, appearing in the same online newspaper, and/or on the same topic. In yet another example, for encoding an image, the dataset may be other similar images, for example, of the same scene, in the same format, and/or taken by the same imaging sensor. Static Huffman coding may use a known distribution of the data elements corresponding to the nature of the baseline dataset, for example, English text with its well known character distribution, or use accurate probabilities for the specific input baseline dataset that are computed via a preprocessing stage. An advantage of using known statistics is saving the preprocessing stage, however, one then relies on the assumption that the given baseline dataset fits the assumed output dataset, which is not always the case. If there is too much discrepancy between the conjectured and the actual output dataset, there might be a loss in the compression gain.

Optionally, the set of data elements used for encoding are defined by the initial analysis of the entire baseline dataset. Alternatively or additionally, the set of data elements used for encoding are pre-defined, for example, based on ASCII codes.

Features described with 106A-108A are iterated for dynamically creating the compressed dataset by sequentially processing each respective data element of the baseline dataset.

At 106A, an encoded data element is computed according to codeword mapped to the respective data element by the output dataset and/or the values computed by the weight function (e.g., weight tree).

Optionally, the encoding is performed by an encoder that is implemented as a statistical encoder. Exemplary statistical encoders are based on, and/or include: dynamic Huffman coding, and/or adaptive arithmetic coding, and Prediction by Partial Mapping (PPM). Other examples of statistical encoders are based on universal codes that are adapted to be adaptive, for example, arithmetic coding, PPM, Elias, Fibonacci, Golomb, Rice, and Shannon Fano. Reference to Humman coding herein is exemplary and not necessarily limiting, as other adaptive coding processes may be implemented.

At 108A, the codewords of the output dataset are adjusted according to the current weight (i.e., computed for the currently processed location in the baseline dataset) to maintain the compression rule. For example, when the weight of the current data element being encoded is higher than other weights of other data elements, and the code word length of the current data element is longer than code word lengths of other data elements, the codewords are adjusted such that the codeword length of the current data element is now shorter than the codeword lengths of the other data elements. The code words are updated such that data elements having relatively higher weights have a code word of relatively shorter length than other data elements having relatively lower weights.

Optionally, the Huffman tree is updated, rather than reconstructing it from scratch after each character, using the sibling property, for example, as described by Gallager. Gallager describes that a tree is a Huffman tree if and only if it has the sibling property.

The sibling property is used to ensure that the updated tree is a Huffman tree. In terms of mathematical notation, the sibling property is defined as follows: A weighted binary tree with m leaves is said to have the sibling property if and only if:

1. The m leaves have nonnegative weights denoted $w_1, \ldots, w_m$, and the weight of each internal node is the sum of the weights of its two children; and 2. The nodes can be numbered in nondecreasing order by weight, so that the nodes indexed $2j-1$ and $2j$ in this numbering are siblings, for $1 \leq j \leq m-1$.

For an example of how the Huffman tree is dynamically updated, reference is now made back to FIG. 3. The Huffman tree is initialized with the weights of column 308A, corresponding to the first position (i.e., i=1) of the baseline dataset. The first c is encoded by 0, and its weight is then decremented by $g(1)=10$ from 23 to 13. The tree gets updated, now having leaves with weights 14, 18 and 13 for a, b and c, respectively, as in column 308B corresponding to index i=2 of the baseline dataset, of table 302. The second c is therefore encoded by the two bits 10. The weight of c is decremented by $g(2)=9$ from 13 to 4, and the following character a is encoded by the two bits 11. The weights are then updated to 6, 18 and 4, as shown in column 308D corresponding to index i=4 of table 302. At this stage, the character b has become the one with the shortest codeword, and the two following bs are encoded each by 0, updating the weight of b first to 11 and then to 5, so that the encoding for the last b becomes 11. After the last b is processed, it is removed from the tree as its frequency has become 0, resulting in a tree containing only c and a. When the last c is processed, the codeword 0 is output, the leaf for c is removed from the tree, and the tree remains with a single node corresponding to a. Since the decoder also discovers that the alphabet of the remaining suffix of the dataset contains only a single character, which must be a, with weight denoted $p_a(8) = \Sigma_{i=8}^{10} g(i) = 6$, the number of repetitions of a may be calculated, thus no additional bits need necessarily be transferred.

At 110A, features described with reference to 106A, and 108A are dynamically iterated for the sequentially arranged data elements of the baseline dataset. Each iteration results in an encoding of one data element, to create one encoded data element. The encoded data elements may be sequentially arranged to form the compressed dataset.

The baseline dataset having a baseline data storage size is compressed to generate the compressed dataset having a data storage size that is smaller than the baseline data storage.

The value of the weight function corresponding to each current sequential location in the baseline dataset is used for encoding of the current data element. The encoded data element is mapped to the respective data element according to a current state of the output dataset, which was computed during the previous iteration for the previous data element. The output dataset is updated for the current respective data element, and used to encode the next data element in the sequence. In other words, act 108A of a certain iteration for a certain data element is followed by 106A of a next iteration for a next data element at the next sequential location of the baseline dataset. Optionally, the sequential iterations (i.e., 106A and 108A) are performed until a single unique data element with at least one instance (optionally multiple instances) remains in the remaining portion of the baseline dataset. In such a case, the output dataset excludes encodings of the remaining instance(s) of the single unique data element. The exclusion of the repeating instances of the last unique data element further reduces the total number of bits of the compressed dataset, in comparison to encoding each of the repeating instances. There is no need to encode a single copy of the last remaining element, since the decoder may deduce the data element (e.g., character) and the exact number of remaining occurrences from the current weight. For example, when the last portion of the baseline dataset is the sequence ggggggggggggg, rather than encoding each "g" into the compressed dataset, nothing needs to be encoded, saving the number of bits otherwise required to encoding the multiple repeating "g"'s. When the compressed dataset (i.e., created from the output dataset) is provided to a decoder for decompression, the decoder computes a number of the remaining instance(s) of the single unique data element according to the weight of the single data element computed by the weight function for a last sequential location. At the end of the compressed file, the decoder determines the only character that has not been encoded and the number of times to repeat this character based on its weight. Additional formal mathematical details are described herein.

At 112A, the compressed dataset is provided. For example, the compressed dataset may be locally stored by the computing device, and/or forwarded to another computing device. The compressed dataset may be provided for decoding.

The compressed dataset includes the encoded data elements of the baseline dataset.

Optionally, a header is computed. The header and the compressed dataset are provided, optionally to a decoder for decoding. The header may be implemented, for example, as metadata appended to a defined location of a file storing the compressed dataset (e.g., appended to the beginning of the compressed dataset), and/or provided as a separate file.

The header includes an initial weight computed by the weight function for each one of the unique data elements in the baseline dataset. The weight is computed for a first location of the baseline dataset according to the weight function computed for sequential locations of each of the instances of each respective unique data element.

Optionally, the details of the chosen model on which the compression process relies, which are used for decoding the compressed dataset may be adjoined to the compressed dataset, for example, as a header. It is noted that when the model is learned adaptively, as in the traditional backward looking codings described herein, no description of the model is necessarily needed, since the model is updated by the encoder and the decoder in synchronization. For static coding the header may include approximate probabilities and/or just the set of codeword and/or codeword lengths. The forward looking as well as the hybrid variants described herein may require the exact frequencies of the data elements. When the alphabet is small, the size of the header might often be deemed negligible relative to the size of the input dataset. Larger alphabets, for example including of all the words in a large textual database (e.g., as described with reference to Alistair Moffat. *Word-based text compression. Softw., Pract. Exper.,* 19(2):185-198, 1989), may often be justified by the fact that the list of different words and their frequencies are needed anyway in an Information Retrieval system.

The compressed dataset is a compressed version of the baseline dataset.

The size of the compressed dataset may be smaller than the baseline dataset. The amount of memory and/or data storage device required to store the compressed dataset is smaller than the amount of memory and/or data storage device required to store the baseline dataset.

At 114A, the compressed dataset may be decoded and/or decompressed into the baseline dataset. The compressed dataset may be decompressed by a decoder. For example, the compressed dataset may be locally decompressed by the computing device, and/or decompressed by another computing device.

The encoding and decoding processes may be implemented as being symmetrical.

A prelude of the number of occurrences of each data element in the baseline dataset (e.g., the initial values of the weight function, which may be stored in the weight tree) may be associated with the compressed file (e.g., prepended), allowing the decoder to be synchronized with the encoder, as the encoder and decoder maintain identical copies of a varying output dataset and/or values of the weight function (e.g., stored in a weight tree), optionally a Huffman tree. When the precise number of occurrences of each data element is already known and/or available to the decoder, for example, in Information Retrieval applications, the overhead may be ignored.

Optionally, the systems, methods, apparatus, and/or code instructions described herein are designed to be easily adapted for compatibility with other existing compression processes. The adaptation may be performed by varying one or more parameters, as described herein. The adaptation provides compatibility with datasets compressed using other existing compression processes, and/or for compression of datasets into other existing compression processes, optionally without requiring installation and maintenance of multiple different encoders and decoders. Moreover, parameters of the systems, methods, apparatus, and/or code instructions described herein may be varied to create additional new encoding processes, while optionally providing compatibility between the different encoding processes.

To provide compatibility for static coding (e.g., standard Huffman coding), the weight computed according to sequential location is set to a constant value of 1, e.g., in terms of mathematical representation $g(i)=1$ for all i. The weight function, which is computed as a function of sequential locations, denoted $s_o$, is set to be constant for all indices and computed according to the first position for the forward weight based on sequential location as described herein. In terms of formal mathematical representation, the weights denoted $s_o$ for each character $\sigma \in \Sigma$ are defined for all indices denoted i as $s_o(i)f_o i(1)$. It is noted that setting the function to be a constant value makes the resulting weights independent of sequential location, and the function is no longer dependent on sequential locations.

In other words, the uses of the term function and weight used herein to refer to functions and/or weights computed based on sequential locations of data elements exclude constant values that are independent of sequential location.

To provide compatibility for adaptive coding (e.g., standard adaptive Huffman coding), the backward weight computed based on sequential location as described herein, is set to a constant value of 1, e.g., in terms of mathematical representation $g(i)=1$ for all i. However, in contrast to the approach for static coding, the weights are not constant throughout, but are recomputed for all indices $1 \leq i \leq n$ according to backward weights defined by the following mathematical relationship:

$$b_\sigma^1(i) = \sum_{\{j<i|T[j]=\sigma\}} 1 = \text{number of occurrences of } \sigma \text{ in } T[1, i-1].$$

The computed weights denote the number of occurrences of the respective data element in a subset of the data elements, i.e., frequency, and are independent of the sequential locations of the data elements. To obtain adaptive coding, the weights and/or functions are adapted to be independent of sequential locations of data elements.

To provide compatibility for encoding process described with reference to FIG. 1B, the forward weight computed according to sequential location is set to a constant value of 1, e.g., in terms of mathematical representation $g(i)=1$ for all i. The model is computed according to suffixes of the dataset. In terms of formal mathematical representation:

$$f_\sigma^1(i) = \sum_{\{j \geq i|T[j]=\sigma\}} 1 = \text{number of occurrences of } \sigma \text{ in } T[i, n]$$

Figure 4:
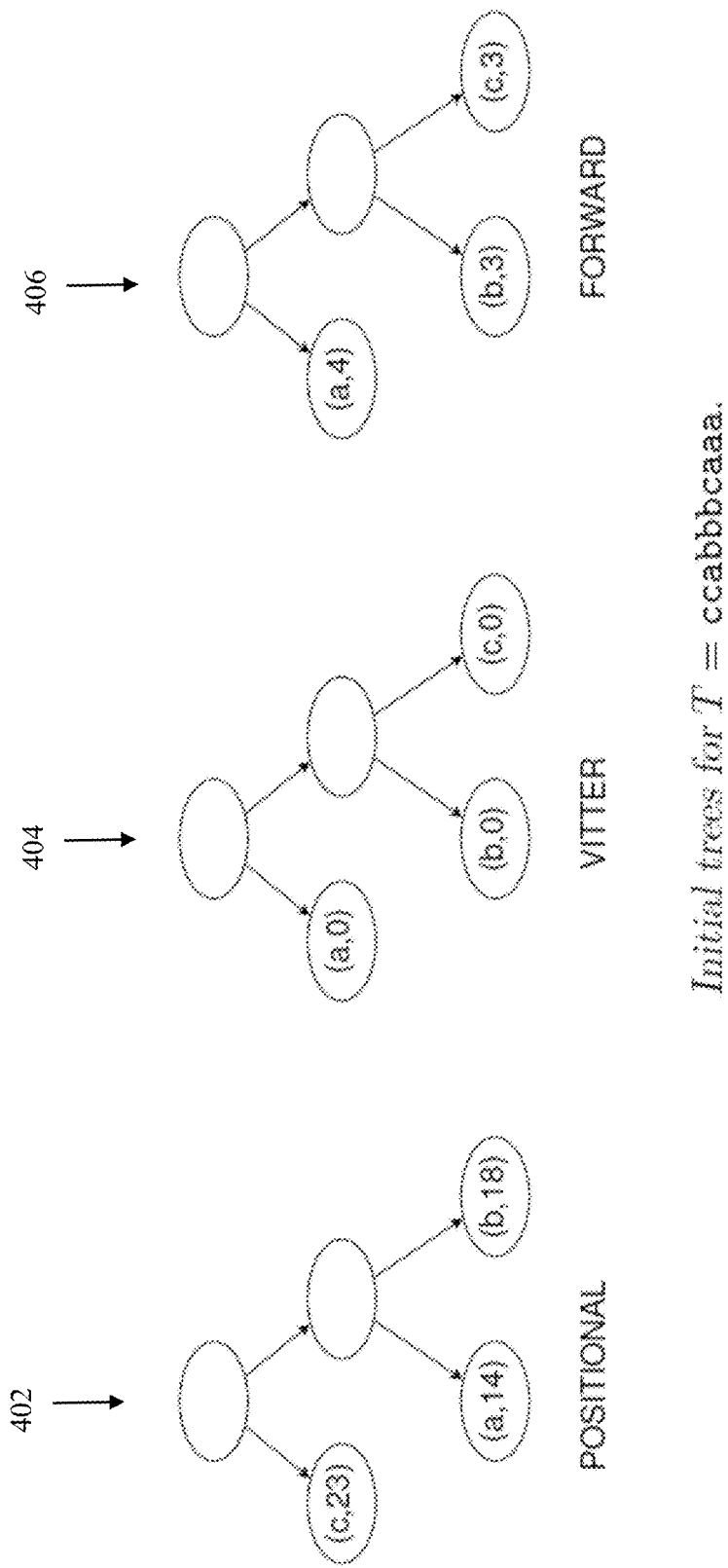
FIG. 4 is a schematic comparing initial trees for the dataset denoted T=ccabbbcaaa computed according to: the encoding described herein, Vitter's approach, and the approach described with reference to FIG. 1B, in accordance with some embodiments of the present invention.

Reference is now made to FIG. 4, which is a schematic comparing initial trees for the dataset denoted T=ccabbbcaaa computed according to: the encoding described herein with reference to FIG. 1A (termed POSITIONAL) 402, Vitter's approach (termed VITTER) 402, and the approach described herein, in particular with reference to FIG. 1B (termed FORWARD) 406, in accordance with some embodiments of the present invention.

The model computed based on Vitter's process need not be transmitted to the decoder as it is learnt incrementally while processing the encoded dataset. It is assumed that the exact alphabet (i.e., set of unique data elements) is known to both encoder and decoder. The special Not-Yet-Transmitted leaf suggested by Vitter for dealing with newly encountered symbols is not necessarily used. Initial tree computed based on Vitter's process 404 starts with all frequencies equal to 0.

The correctness of Vitter's process relies on the sibling property (e.g., according to Galalger), which states that a tree is a Huffman tree if and only its nodes can be listed by nonincreasing weight so that each node is adjacent to its sibling. The sibling property convention is used to place the nodes in a Huffman tree in such a way that this list can be obtained by a bottom-up, left to right scan of the nodes.

Using initial Vitter based tree 404, and relying on the sibling property, the following is a process for encoding the dataset T=ccabbbcaaa: The codeword for c is 11, and its frequency is incremented by 1, resulting in a shorter codeword, 0, for the following c, by swapping the leaves of a and c. The next character a is encoded by 11, and its frequency is updated, but the tree remains unchanged. The following two characters are b and b, both of which are encoded by 10. The frequency of b gets updated first to 1, then to 2, resulting in a swap with the leaf for a in order to retain the sibling property. For the next and last b the codeword 11 is outputted, its frequency is increased to 3, and its leaf is swapped with the leaf corresponding to c. The following character c results in the output of the codeword 11 and an update of its frequency to 3. The codewords for each of the last three a's is then 10, incrementing weight of a from 1 to 2, 3, and 4, where the tree is changed only at the last step, only after the last a has already been encoded.

Tree 406, which is initialized and updated based on the process described herein, in particular with reference to FIG. 1B, ends with an empty tree. The tree is initialized with weights denoted $(f_a^1(1), f_b^1(1), f_c^1(1))=(4, 3, 3)$, for example, using the initialization process of static Huffman encoding. The following is a process for encoding the dataset T=ccabbbcaaa starting from tree 406 and using the process described herein, in particular with reference to FIG. 1B 406: The first c is encoded by 11, and the frequency of c is decremented to 2, resulting in an interchange of b and c. The second c is therefore encoded by 10, and its frequency is updated to 1. The character a is then encoded by 0 and its weight is decremented to 3. The following three b's are encoded by 11 and the frequency for b is repeatedly decremented to 0 and its leaf is finally removed from the tree. The tree remains with 2 leaves for a and c, and the following character c is encoded by 0. The last three a's need not be encoded as described herein with reference to the encoding process described herein, since their presence may be inferred.

Reference is now made to FIG. 5, which is a table 502 summarizing the encodings during the encoding approach described herein with reference to FIG. 1A (i.e., POSITIONAL), the VITTER approach, and the approach described herein, in particular with reference to FIG. 1B (i.e., FORWARD), in accordance with some embodiments of the present invention. The encodings in the table are computed using the initial trees and encoding process detailed with reference to FIG. 4.

Columns 504A-C of table 502 display the initial weights of the respective data elements (e.g., as shown in respective initialization trees 402, 404, and 406 of FIG. 4). The data elements may be encoded and prepended to the compressed dataset, for example, as a header. Region 506 of table 502 shows the binary output sequences produced by the different approaches, as described in detail with reference to FIG. 4. Although all the reported outcomes described in the "Examples" section include the appropriate header for each approach (it is noted that the header is empty for the implementation based on Vitter's process), no precise binary encoding are included in the small example of table 502. The header is generally of secondary importance relative to the size of real life input datasets, but it might distort the outcome of the comparison on a small artificial example as the one presented in table 502.

The net number of bits required to encode the dataset denoted T for the example by the three alternative approaches summarized in table 502 is 10, 19 and 12 for POSITIONAL, VITTER and FORWARD, respectively. Note that the first a is encoded by a single bit by FORWARD and by two bits by POSITIONAL, illustrating that although there are overall savings in space, the individual codewords assigned by FORWARD may be locally shorter than the corresponding ones of POSITIONAL.

The following is a mathematical analysis that provides evidence that compression using at least some implementations of the systems, methods, apparatus, and/or code instructions described herein with reference to FIG. 1A (denoted POSITIONAL) is at least as good as compression using the systems, methods, apparatus, and/or code instructions described herein, in particular with reference to FIG. 1A (denoted POSITIONAL) and with reference to FIG. 1B (denoted FORWARD)-B is better than standard static Huffman coding (denoted STATIC Huffman) by at least $|\Sigma|-1$ bits.

Theorem: For a given sequence of data elements denoted having a length (i.e., number of data elements in the sequence) denoted n, the average codeword length of the compression process using at least some implementations of the systems, methods, apparatus, and/or code instructions described herein with reference to FIG. 1A (i.e., POSITIONAL) is at least as good as the code word length of the compression process described with reference to FIG. 1B (i.e., FORWARD).

Proof sketch: The construction on which the proof is based is provided. A sequence of functions denoted $\mathcal{G} =\{g_j\}_{j=1}^n$ is constructed as follows, the first function being the function corresponding to FORWARD and the last one to POSITIONAL. The function denoted $g_1$ is thus a constant function denoted $g_1(i)=1$. For $j \geq 2$, we $g_j$ is defined recursively by:

$$g_j(i) = \begin{cases} j & i \leq (n-j+1) \\ g_{j-1}(i) & i > (n-j+1) \end{cases}$$

so $g_j$ is constant up to $n-j+1$ and then decreases linearly.

Figure 6:
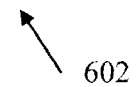
FIG. 6 is a table presenting values of a linear weight function for the coding of a baseline dataset, in accordance with some embodiments of the present invention.

Reference is now made to FIG. 6, which is a table 602 presenting values of the function $g_j$ that is constant up to $n-j+1$ and then decreases linearly for the coding of the sequence denoted T=abbbcaaa, in accordance with some embodiments of the present invention.

The proof is by induction on j and shows that weighted coding based on $g_{i+i}$ is at least as good as weighted coding based on $g_j$ according to the compression process described herein, in particular with reference to FIG. 1B (i.e., FORWARD), for all j, so that ultimately, the compression process using at least some implementations of the systems, methods, apparatus, and/or code instructions described herein with reference to FIG. 1A (i.e., POSITIONAL) is at least as good as the code word length of the compression process described with reference to FIG. 1B (i.e., FORWARD).

Figure 7:
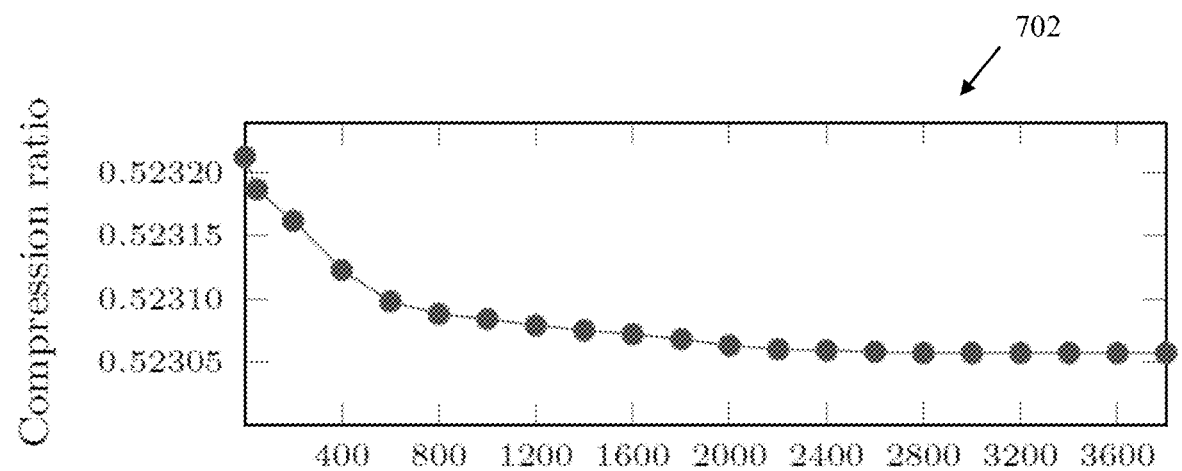
FIG. 7 is a graph illustrating the behavior of a family of functions, in accordance with some embodiments of the present invention.

Reference is now made to FIG. 7, which is a graph 702 illustrating the behavior of the family of functions denoted $\mathcal{G}$, in accordance with some embodiments of the present invention. Graph 702 depicts the relative size of the compressed dataset of sequential elements for selected values of j on the test dataset described in the "Experiment" section below. As expected, the resulting curve is decreasing.

Referring now back to FIG. 1B, at 102B, a baseline data is provided and/or created. The baseline dataset is the non-compressed dataset for compression. The baseline dataset may be, for example, manually selected by a user for compression (e.g., using a graphical user interface) and/or automatically selected by code (e.g., code that manages backup data, code that compresses data for transmission over a network).

The baseline dataset includes multiple sequentially arranged data elements. Data elements are re-used, such that each data elements appears multiple times within the baseline dataset. Data elements of the baseline dataset may be defined by a set of unique data elements, for example, an alphabet, text letters, symbols (e.g., non-text, and/or including both text and non-text), text words, words (e.g., non-text words, and/or including both text and non-text words, and/or words including both text and/non-text symbols). The alphabet may include, for example, ASCII characters and/or symbols, EBCDIC characters and/or symbols, UNICODE characters and/or symbols, and letters of a natural language. The alphabet may include elements, each of which is a string of one or more characters, for example, words of a natural language.

Optionally, the entire baseline dataset is available, for example, stored in a data storage device, for example a stored file. Alternatively or additionally, a portion of the baseline dataset is not yet available, for example, does not yet exist, and/or has not yet been received (e.g., not yet transmitted by a remote server), and/or not yet available (e.g., file stored on data storage device is dynamically updated and does not yet include portions of the baseline dataset for encoding). For example, the baseline dataset stores digitized audio recorded during a phone conversation. Such baseline dataset cannot store audio that has not yet been spoken and recorded, although such audio is scheduled for compression. In such a case, the baseline dataset may be dynamically created and encoded, as described herein.

At 104B, an output dataset that stores a mapping between data elements and codewords is created and/or provided. Each one of the data elements in the baseline dataset is mapped to a corresponding codeword for encoding the respective data element. A weight dataset that stores a weight for each of the data elements in the baseline is created and/or provided and/or initialized.

The weight dataset and/or output dataset are used to compress the baseline dataset into the compressed dataset, by encoding the data elements of the baseline dataset into corresponding codewords, as described herein.

The output dataset maps each data element which may be defined by a set of data elements, to a single unique codeword. The baseline dataset may include one or more instances of each data element, for example, the set of data elements may be defined as an alphabet, and/or set of symbols and/or set of characters. For example, each letter "k" is mapped to the codeword 0110, and each letter "q" is mapped to the codeword 111.

The weight dataset stores a weight in association with each one of the data elements. The weight is indicative of the data elements in the remaining, not yet encoded, portion of the baseline dataset, which is for future encoding. An exemplary weight, where each weight is associated with one respective data element, includes: a frequency of occurrence of the certain data element in the remaining portion of the baseline dataset. The frequency may denote the number of occurrences of the certain data element in the remaining portion of the baseline dataset. For example, weight=5 indicates that there are 5 remaining occurrences of the certain data element in the portion of the baseline dataset that has not yet been encoded, e.g., frequency=5.

The output dataset and weight dataset may be implemented as separate data structures, for example, tables, key-value pairs, pointers, trees, and the like. Each dataset may be managed independently, for example, updated and/or adjusted as described herein. For example, the values of the weight dataset are decremented, and the codewords of the output dataset are adjusted to maintain the compression rule.

Alternatively or additionally, the output dataset and weight dataset are implemented in a common data structure, optionally a single dataset, for example, tables, key-value pairs, pointers, trees, and the like.

Optionally, a binary weighted tree is associated with the weight dataset, and/or the output dataset is considered as being equivalent to the binary weighted tree, as two different trees, or as a single tree. Optionally, the coding dataset and/or weight dataset are implemented as the binary weighted tree. The binary weighted tree may include a number of leaves corresponding to a number of different data elements. Each leaf node is associated with a certain data element, a certain codeword for encoding the certain data element, and the current weight of the certain data element. Higher up nodes may store a sum of the weights of their children nodes. The root node may store a sum of weights of all data elements, indicative of the number of data elements in the non-encoded portion of the baseline dataset remaining to be encoded.

Optionally, the output dataset and/or weight dataset are implemented as a Huffman tree. The compression rule may be according to the Huffman tree compression rule.

Optionally, the codewords in the output dataset are arranged according to a compression rule. The compression rule defines that data elements associated with a relatively higher weight are associated with codewords that are relatively shorter in comparison to data elements associated with relatively lower weight. For example, a certain data element with a weight of 15 has a codeword 010, and another data element with a lower weight of 5 has a longer codeword 11000110. In other words, the more frequent the occurrence of a certain data element, the shorter its codeword. The shorter codewords for more frequently occurring data elements are selected to produce an overall compression of the baseline dataset.

Optionally, an initial state of the weight dataset stores weights representing an actual distribution of the data elements in the baseline dataset. The actual distribution may be obtained by processing the entire baseline dataset, for example, counting the number of occurrences of each data element in the baseline dataset.

Alternatively or additionally, the weight of each one of the data elements in the initial baseline dataset stored is computed from one or more other dataset that is estimated to be statistically similar to the baseline dataset and/or are defined from the other dataset. For example, for encoding speech of a phone conversation, the dataset may be of prior phone conversations, for example, between the same two individuals. In another example, for encoding a newspaper article, the dataset may be other newspaper articles, for example, by the same author, appearing in the same online newspaper, and/or on the same topic. In yet another example, for encoding an image, the dataset may be other similar images, for example, of the same scene, in the same format, and/or taken by the same imaging sensor. Static Huffman coding may use a known distribution of the data elements corresponding to the nature of the baseline dataset, for example, English text with its well known character distribution, or use accurate probabilities for the specific input baseline dataset that are computed via a preprocessing stage. An advantage of using known statistics is saving the preprocessing stage, however, one then relies on the assumption that the given baseline dataset fits the assumed output dataset, which is not always the case. If there is too much discrepancy between the conjectured and the actual output dataset, there might be a loss in the compression gain.

Optionally, the set of data elements used for encoding are defined by the initial analysis of the entire baseline dataset. Alternatively or additionally, the set of data elements used for encoding are pre-defined, for example, based on ASCII codes.

Features described with 106B-110B are iterated for dynamically creating the compressed dataset by sequentially processing each respective data element of the baseline dataset.

At 106B, an encoded data element is computed according to codeword mapped to the respective data element by the output dataset and/or the weight dataset.

Optionally, the encoding is performed by an encoder that is implemented as a statistical encoder. Exemplary statistical encoders are based on, and/or include: dynamic Huffman coding, and/or dynamic arithmetic coding. Other examples of statistical encoders are based on universal codes that are adapted to be adaptive, for example, Elias, Fibonacci, Golomb, Rice, and Shannon Fano.

At 108B, the weight dataset is updated by decrementing the weight of the respective data element. Optionally, the weight is decremented by one, indicating that one less data element is included in the remaining non-encoded portion of the baseline dataset. Other the updating may be performed using other values according to other implementations of the weight.

Optionally, when the weight of the certain data element reaches a value indicating a last occurrence of the certain dataset in the remaining portion of the baseline dataset, the entry in the weight dataset and/or output dataset associated with the certain data element is removed. For example, when the weight reaches 0 or 1 denoting no more remaining occurrences of the data element, the entry of the data element may be removed. For example, the leaf node in the Huffman tree associated with the data element is removed. Alternatively, the entry of the certain data element (e.g., leaf node) is not removed from the output dataset and/or weight dataset, but may be maintained at the lowest value, for example, at 0, 1, or other values. The entry may be maintained, for example, for baseline datasets in which the initial values of the weight dataset are based on a prediction (e.g., dynamically created and/or dynamically provided baseline datasets). Since the actual weight of the certain data element is not known for sure, but is a prediction and/or estimate, maintaining the entry (e.g., leaf node) enables processing additional occurrences of the certain data element, which may be unexpected occurrences.

At 110B, the codewords of the updated output dataset are adjusted to maintain the compression rule. For example, when decrementing the weight associated with the certain data element having a relatively short codeword length results in the decremented weight being lower than other weights of other certain data elements having relatively longer codeword lengths, the codewords are updated such that the codeword length of the certain element is now longer than the codeword lengths of the other data elements. It is noted that as described herein, such updating is counter intuitive, since it results in a longer codeword length for the current data element. However, as described herein, inventors discovered that overall, the compression size of the compressed baseline dataset may be improved, since the codeword length of the other data elements is decreased.

Optionally, the Huffman tree is updated, rather than reconstructing it from scratch after each character, using the sibling property. The sibling property is used to ensure that the updated tree is a Huffman tree. In terms of mathematical notation, the sibling property is defined as follows: A weighted binary tree with m leaves is said to have the sibling property if and only if:

1. The m number of leaves have nonnegative weights denoted $w_1, \ldots, w_m$, and the weight of each internal node is the sum of the weights of its two children; and 2. The nodes can be numbered in nondecreasing order by weight, so that the nodes indexed $2j-1$ and $2j$ in this numbering are siblings, for $1 \leq j \leq m-1$.

Robert Gallager, "*Variations on a theme by Huffman,*" IEEE '.*transactions on Information Theory*, vol. 24, no. 6, pp. 668-674, 1978 describes that a tree is a Huffman tree if and only if it has the sibling property.

Figure 10:
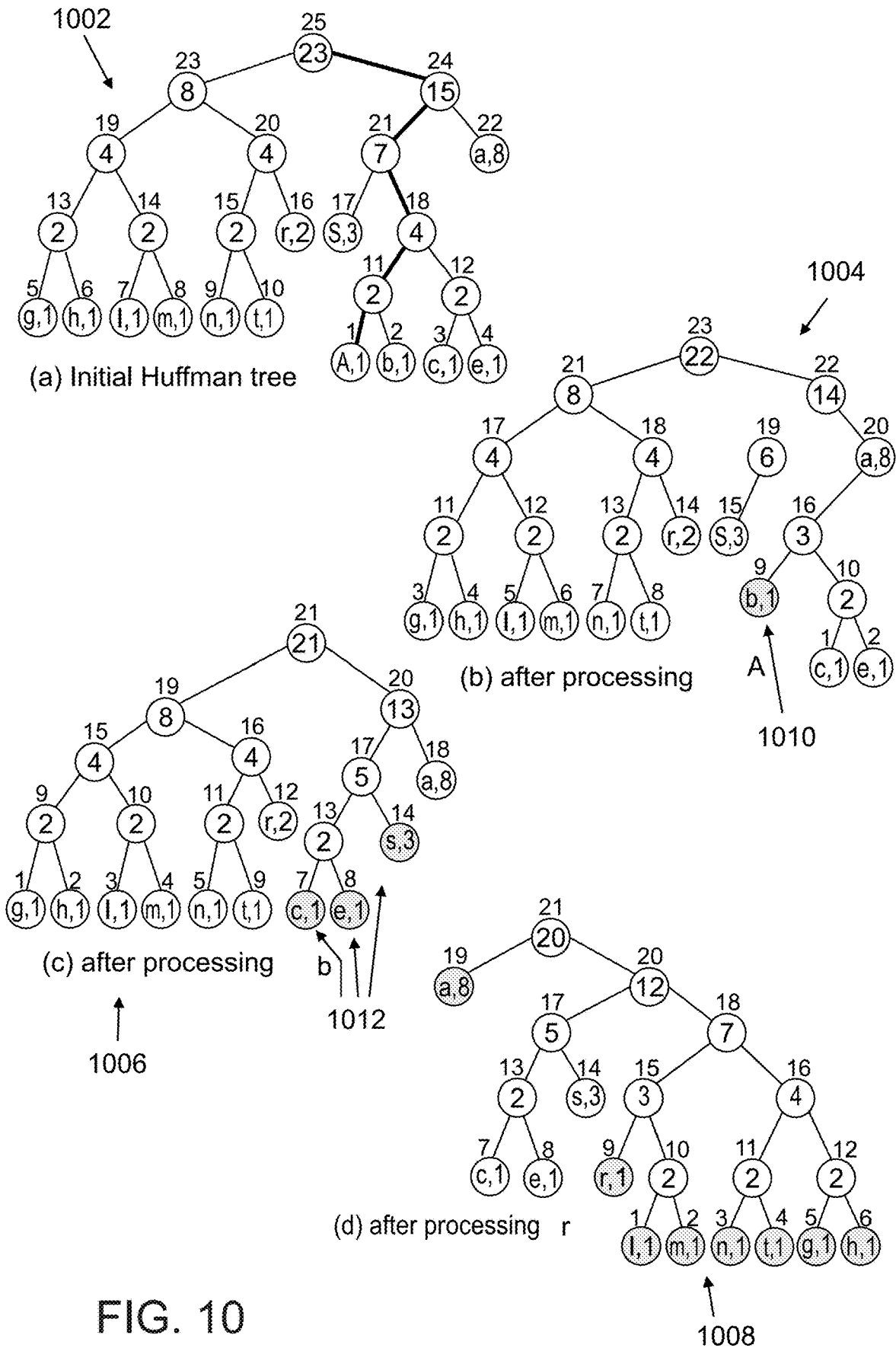
FIG. 10 includes coding and weight datasets implemented as Huffman trees that are updated in response to encoding of data elements of a baseline dataset, in accordance with some embodiments of the present invention.

Reference is now made to FIG. 10, which include coding and weight datasets implemented as Huffman trees 1002 1004 1006 1008 that are updated in response to encoding of data elements of a baseline dataset denoted T that stores the data elements Abrahamasantaclaragasse, in accordance with some embodiments of the present invention. Internal nodes include their weights. A leaf node for a certain data element (e.g., character) denoted x includes the pair (x, f(x)), where f(x) denotes frequency of the respective data element x. As discussed herein, the frequency denotes the number of remaining occurrences of data element x in the remaining (i.e., not yet encoded) portion of the dataset. Index numbering used for ensuring the sibling property are presented above the nodes. A bottom-up, left to right numbering is used, but it is noted that other numbering schemes are plausible, as long as they comply with the sibling property.

In order to help understand the procedure for updating the coding set by at least some of the systems, methods, apparatus, and/or code instructions described herein, an update procedure used by the standard dynamic Huffman coding process for updating a Huffman tree is described. For a currently processed data element (e.g., character) denoted c, the weights of all the nodes on the path from the leaf node corresponding to c up to the root are to be incremented by 1 (which as described herein is different than the implementation of at least some of the systems, methods, apparatus, and/or code instructions described herein that decrement the weight of the respective data element). For example, with reference to 1002, when the next data element for encoding is c=r whose leaf is the node indexed 16, the weights of the nodes indexed 16, 20, 23 and 25 are incremented to 3, 5, 9 and 24, respectively. It is noted that for the described example, the sibling property still holds after the updates (with the same numbering), so no further action is needed. However, in other cases, the increments may disrupt the monotonicity of the numbering.

Now, consider the case in which the next data element is c=A, rather than r. The path from the leaf to the root is emphasized in 1002, and the weights of the nodes indexed 1, 11, 18, 21, 24 and 25 are incremented to 2, 3, 5, 8, 16 and 24, respectively. If the same numbering is maintained, the weights of nodes 10-13 would be 1, 3, 2, 2, which is not a monotone sequence. In fact, with the present layout of the tree 1002, no numbering can fulfill the second condition of the sibling property.

The difference between the above two described examples is that in the first example, all the nodes that are updated have indexes which are maximal for their given weights before the increments, a property which does not hold for the second example. Indeed, there are many nodes with weight 2, all those with indexes 11 to 16, and the leaf (r,2) is indexed 16; nodes 18 to 20 have weight 4, nodes 22 and 23 have weight 8, and only node 25 has weight 23. On the other hand, for the second example, the leaf (A, 1) is indexed 1, but there are also other nodes with weight 1 and that have higher indexes (up to 10); node 18 has weight 4, and node 20, which has a higher index, has also weight 4.

It is noted that, the rule holds in general and not only for the examples, since a non-decreasing sequence of integers will remain such, even if the highest ranking elements within the sub-sequences of identical integers are incremented by 1. For example, • • • 6 6 7 7 7 7 9 9 • • • may turn into • • • 6 7 7 7 7 8 9 9 • • • , which is still non-decreasing. To ensure that only such highest ranking nodes are updated, the dynamic Huffman process exploits another property of Huffman trees, namely that nodes with identical weights may be interchanged. More precisely, since swapping the nodes may actually be implemented by swapping the pointers to them, not just the nodes are interchanged, but the entire sub-trees rooted by these nodes. As a result, the shape of the tree might change, which yields a different set of codewords, but the weighted total path-length $\Sigma_{i=1}^{m} w_i l_i$ remains the same, so that the transformed tree is also a legitimate Huffman tree minimizing this sum, which represents the size of the compressed baseline dataset.

At least some of the systems, methods, apparatus, and/or code instructions described herein adjust the codewords of the output dataset by adapting the dynamic Huffman process. After each encoded data element, the number of its occurrences (i.e., weight thereof) is decremented by 1. Before doing so, each node on the path from the updated leaf node to the root is swapped, if necessary, with the smallest numbered node of identical weight. Then the weights of these nodes can be decremented without violating the sibling property. To continue the previous example, • • • 6 6 7 7 7 7 9 9 • • • may now turn into • • • 6 6 6 7 7 7 8 9 • • • .

At 112B, features described with reference to 106B, 108B, and 110B are dynamically iterated for the sequentially arranged data elements of the baseline dataset. Each iteration results in an encoding of one data element, to create one encoded data element. The encoded data elements may be sequentially arranged to form the compressed dataset.

Optionally, the updating of the weight dataset described with reference to act 108B is performed after the encoding of the certain data element described with reference to act 106B. The version of the weight dataset, having the current adjusted weights, which was updated in the previous iteration, is used for encoding of the next data element. The encoded data element is mapped to the respective data element according to a current state of the output dataset, which was computed during the previous iteration for the previous data element. The output dataset is updated for the current respective data element, and used to encode the next data element in the sequence. In other words, act 108B of a certain iteration for a certain data element is followed by 106B of a next iteration for a next data element.

At 114B, the compressed dataset is provided. For example, the compressed dataset may be locally stored by the computing device, and/or forwarded to another computing device.

The compressed dataset includes the encoded data elements of the baseline dataset.

The compressed dataset is a compressed version of the baseline dataset.

The size of the compressed dataset may be smaller than the baseline dataset. The amount of memory and/or data storage device required to store the compressed dataset is smaller than the amount of memory and/or data storage device required to store the baseline dataset.

At 116, the compressed dataset may be decoded and/or decompressed into the baseline dataset. The compressed dataset may be decompressed by a decoder. For example, the compressed dataset may be locally decompressed by the computing device, and/or decompressed by another computing device.

The encoding and decoding processes may be implemented as being symmetrical.

A prelude of the number of occurrences of each data element in the baseline dataset (e.g., the initial weight dataset) may be associated with the compressed file (e.g., prepended), allowing the decoder to be synchronized with the encoder, as the encoder and decoder maintain identical copies of a varying output dataset and/or weight dataset, optionally a Huffman tree. When the precise number of occurrences of each data element is already known and/or available to the decoder, for example, in Information Retrieval applications, the overhead may be ignored Reference is now made to FIG. 11, which is a pseudocode 1102 of an exemplary implementation of the encoding process described herein, in accordance with some embodiments of the present invention. The decoding process is symmetrical.

T denotes the baseline dataset for compression, for example, a text. $x_1 \ldots x_n$ denote the data elements, i.e., characters, of T.

Initially, a Huffman tree is computed for T using the Huffman static encoding process for computing a Huffman tree. After every read data element denoted $x_k$ the corresponding codeword is used to determine the encoded data element, which is aggregated to create the compressed dataset. The Huffman tree is updated and adapted to correspond to frequencies within $\{x_{k+1} \ldots x_n\}$ as described herein.

Lines 11-14 of pseudo-code 1102 relate to the case where the weight of leaf($x_k$) has been reduced to 0, indicating that the last occurrence of the character $x_k$ is encountered. Note that in this case, the leaf is the lowest numbered one and is (e.g., must be) the left child of its parent node denoted q. This leaf may be eliminated from the tree, by replacing parent node q with the right child, which is the leafs left sibling. Whenever the structure of the tree is adapted (in lines 8 or 13), it is assumed that the numbering of the nodes, referred to in the sibling property, is updated as well.

For example, referring also back to FIG. 10, where dataset T=Abrahamasantaclaragasse (i.e., the name of a street in Vienna) over the set of data entity types (e.g., alphabet) {A, a, b, c, e, g, h, l, m, n, r, s, t} with corresponding weights {1, 8, 1, 1, 1, 1, 1, 1, 1, 1, 2, 3, 1}. One of the possible Huffman trees is used as an initial weight and/or output dataset, for example, tree 1002, where the leaves are assigned in lexicographical order. The 1004 1006 1008 trees are obtained after the processing, by pseudo-code 1102, of the first other trees three characters of T, A, b and r, respectively.

When data element A is processed, the nodes on the emphasized path from the leaf (A,1) to the root are the lowest indexed of their corresponding weights, so no interchanges in lines 6-8 are needed; the weight of each node on this path is then decremented, the parent of (A, 1) is overwritten by the sibling of (A,1), which is the leaf (b,1), and the leaf (A,1) is erased from the tree. The resulting tree is 1004 where the leaf that corresponds to the only codeword that has been changed, appears in gray 1010. The shape of the tree has changed, therefore, a new numbering is necessary.

When the following data element b is processed, the corresponding leaf, numbered 9, is not the node with the lowest index among those with weight 1. Nodes 9 and 1 are therefore interchanged. Climbing up the tree from the new position of the leaf (b,1), node 10 is reached, which is the lowest numbered node of weight 2. However, its parent node 16 has weight 3, as has also node 15. Therefore the leaf (s,3) is interchanged with the subtree rooted at node 16. The process continues to nodes 19, 22 and 23, whose corresponding weights are the smallest indexed ones for the weights 6, 14 and 22, respectively, so no further updates are needed, creating tree 1006. The changed codewords are in gray 1012.

The processing of character r starts by swapping the nodes 12 and 9 in tree 1006, and then continues to node 15, which is the lowest indexed of weight 4. Its parent node 19, is interchanged with leaf 18; the updates continue with nodes 20 and 21. Finally, the weights of the nodes on the new path from the root to leaf (r,2) are decremented, resulting in tree 1008.

Various embodiments and aspects of the present invention as delineated hereinabove and as claimed in the claims section below find calculated support in the following examples.

EXAMPLES

Reference is now made to the following examples of data compression, which together with the above descriptions illustrate some implementations of the systems, methods, apparatus, and/or code instructions described herein in a non limiting fashion.

Figure 8:
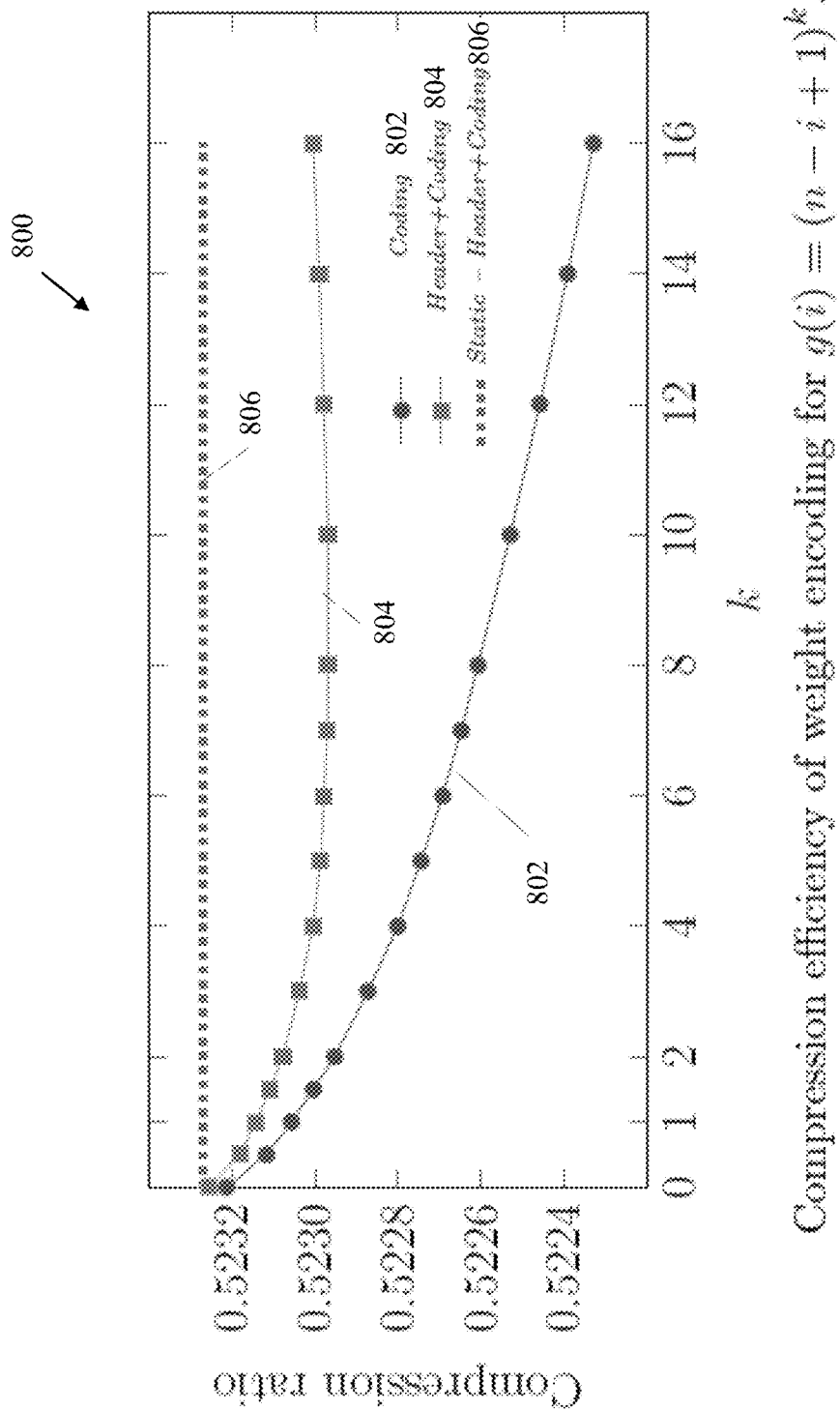
FIG. 8 is a graph presenting compression efficiency of weight encoding using a linear weight function, in accordance with some embodiments of the present invention.

Inventors performed computational evaluations to obtain empirical evidence on compression performance by at least some implementations of the systems, apparatus, methods, and/or code instructions described with reference to FIGS. 1A, 2B, and 3-7 for datasets of different languages, sizes, and/or nature, the results of which are described below with reference to FIGS. 8-9. Since results were similar for the different datasets, the experiment described below is for the performance of an exemplary dataset—the King James version of the English Bible (in which the text has been stripped of all punctuation signs). Results are compared to standard static Huffman compression processes.

In order to handle the arithmetic of the huge numbers that are used for the coding, the GNU Multiple Precision Arithmetic Library (e.g., found in http://gmplib(dot)org) was used.

First weighted Huffman coding corresponding to functions of the form denoted $g(i)=(n-i+1)^k$ were considered. Reference is now made to FIG. 8, which is a graph 800 presenting compression efficiency of weight encoding using the function $g(i)=(n-i+1)^k$, in accordance with some embodiments of the present invention. The compression ratio, defined as the size of the compressed dataset divided by the size of the original dataset, is computed for integer values of k ranging from 0 to 16, as well as for k=0.5 and k=1.5. In particular, compression using the process described herein, in particular with reference to FIG. 1B (i.e., FORWARD) is the special case when k=0, and encoding based on the systems, methods, apparatus, and/or code instructions described herein with reference to FIG. 1B (i.e., POSITIONAL) corresponds to k=1. A lower graph 802 denotes the net encoding while an upper graph 804 includes a header. As visually depicted, the compression efficiency improves as the value of k increases, until about k=8 where the combined dataset+header sizes starts to increase (graph 804), However being still better than the size computing using FORWARD. The compression ratio for static Huffman, denoted by graph 806, is presented for comparison.

The family of functions denoted $g(i)=(n-i+1)^k$ considered in the first set of experimental evaluations does not retain a constant ratio between consecutive positions denoted i, which yields a bias towards higher values of i. For example, referring to the weight function described herein, position 1 is assigned the weight denoted p(1)=10, but the sum of weights from position 1 and on is denoted $\Sigma_{i=1}^{10}(10-i+1)$ =55, so the relative weight for i=1 is 10/55=0.18; on the other hand, p(8)=3 yielding a relative weight for position 8 of 3/(3+2+1)=0.5.

In the following experimental evaluation, another family of functions denoted $g(i)=l^{m-i}$, is considered, where l denotes a real number slightly larger than 1, which retains a ratio of l between consecutive indices.

Figure 9:
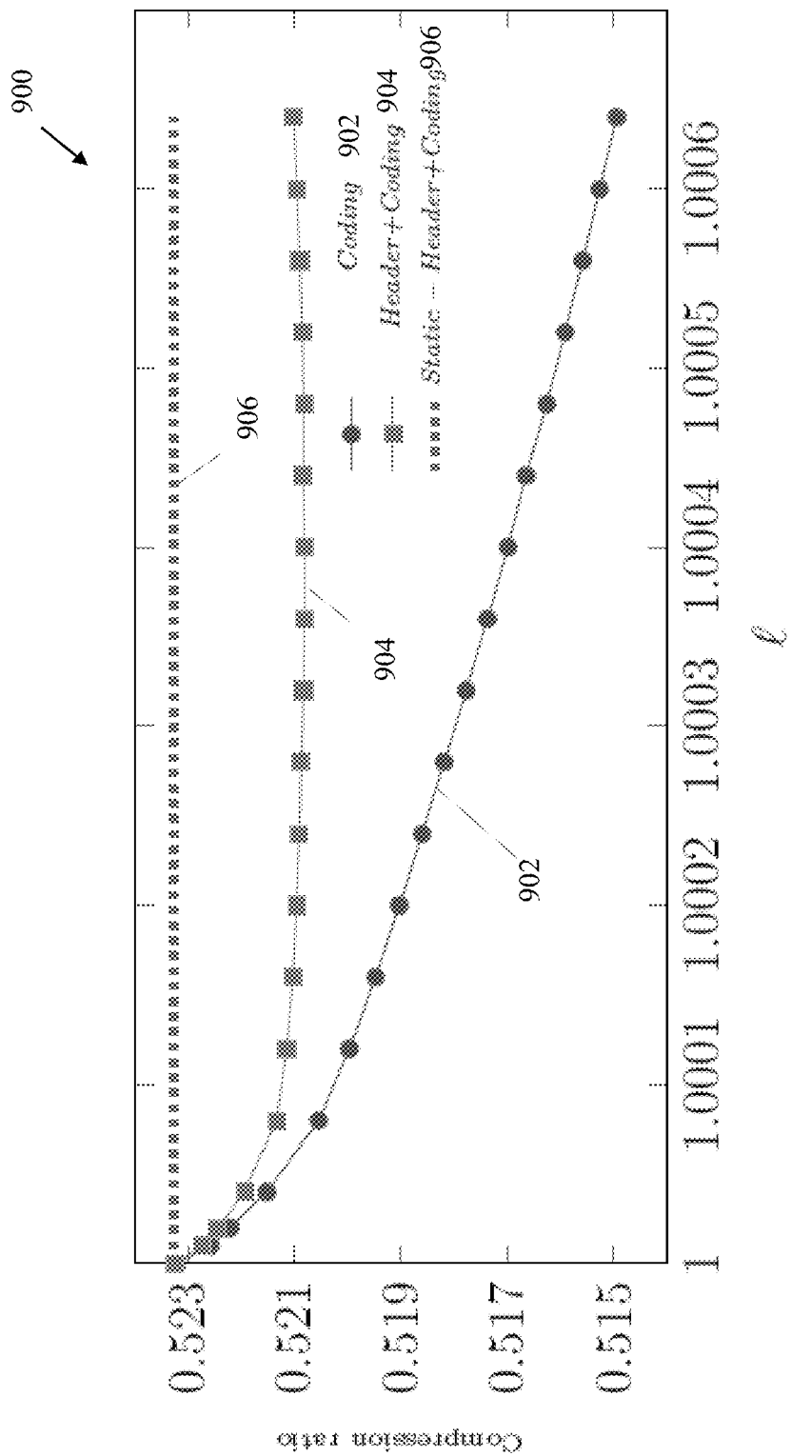
FIG. 9 is a graph presenting compression efficiency of weight encoding using an exponential weight function, in accordance with some embodiments of the present invention.

Reference is now made to FIG. 9 which is a graph 900 presenting compression efficiency of weight encoding using the function $g(i)=l^{m-i}$, in accordance with some embodiments of the present invention. The compression ratio, defined as the size of the compressed dataset divided by the size of the original dataset, is computed for values of l. In particular, compression using the process described herein, in particular with reference to FIG. 1B (i.e., FORWARD) is the special case when l=1. A lower graph 902 denotes the net encoding while an upper graph 904 includes a header. As visually depicted, an improvement in the compression efficiency is achieved, with optimal compression ratio achieved for l=1.0004. The compression ratio for static Huffman, denoted by graph 906, is presented for comparison.

For both families of weight functions based on sequential position, there is an evident improvement in the compression performance using the systems, methods, apparatus, and/or code instructions described, in comparison to the standard Huffman based encoding approach.

The computational evaluations provide empirical evidence that the systems, methods, apparatus, and/or code instructions described herein which are based on weights computed according to sequential locations of the data elements are always at least as good as the process described herein, in particular with reference to FIG. 1B (i.e., FORWARD), even when the compressed dataset includes a header (i.e., model description).

Inventors performed computational evaluations to compare compression performance obtained by at least some implementations of the systems, methods, apparatus, and/or code instructions described herein with reference to FIGS. 1B, 2B, and 10-11 in comparison to standard static and dynamic Huffman compression processes, the results of which are described below with reference to FIGS. 12-13.

Inventors used texts of different languages and alphabet sizes: ftxt is the French version of the European Union's JOC corpus, a collection of pairs of questions and answers on various topics used in the ARCADE evaluation project as described with reference to Jean Veronis and Philippe Langlais, "*Evaluation of parallel text alignment systems: The ARCADE project,*" in *Parallel Text Processing*, J. Veronis, ed., Kluwer Academic Publishers, Dordrecht, Chapter 19, 2000, pp. 369-388; sources is formed by C/Java source codes obtained by concatenating all the .c, .h and .java files of the linux-2.6.11.6 distributions; English is the concatenation of English text files selected from etext02 to etext05 collections of the Gutenberg Project, from which the headers related to the project were deleted so as to leave just the real text; exe is the executable file of the static Huffman source code that was used; and bible is the Bible (King James version) in basic English, Textfile 980302. The alphabet included individual ASCII characters for all test files, except the last one, for which the different words have been used.

The goal was to compare the compression performance of three methods: static Huffman (denoted STATIC), the compression processed based on at least some implementations of the systems, methods, apparatus, and/or code instructions described herein (denoted FORWARD), and the traditional dynamic Huffman (denoted DYNAMIC).

To allow a fair comparison, it should be taken into account that the weight and/or output datasets on which the methods rely require different amounts of storage for their encodings. For example, static Huffman coding does not need the exact frequencies of the m characters; if a canonical Huffman tree is used (e.g., as described with reference to Eugene S. Schwartz and Bruce Kallick, "*Generating a canonical prefix encoding,*" *Communications of the ACM*, vol. 7, pp. 166-169, 1964), it suffices to transmit its quantized source denoted $<n_1, n_2, \ldots, n_k>$ (e.g., as defined in Thomas J. Ferguson and J. H. Rabinowitz, '.*Self-synchronizing Huffman codes,*" *IEEE Trans. Information Theory*, vol. 30, no. 4, pp. 687-693, 1984), where $n_i$ denotes the number of codewords of length i, for $1 \leq i \leq k$, and k denotes the longest codeword length. For example, the quantized source of the canonical tree equivalent to that of tree 1002 in FIG. 10 is (0, 1. 2, 6, 4). By using a canonical tree, the transmission of the frequencies may be saved, but the sequence of characters (i.e., data elements) must then be sorted by frequency order. If, on the other hand, a non-canonical tree is acceptable, the order of the characters (i.e., data elements) may be implicit, e.g., lexicographic, but then the length of each of the m codewords is required.

The encoding process implemented by at least some of the systems, methods, apparatus, and/or code instruction described herein is fed the frequencies (i.e., weights) of the data elements, in addition to corresponding codeword lengths. In contrast, the standard dynamic Huffman method does not require an input of data element frequencies, since the frequencies are incrementally learned by both encoder and decoder.

Based on the above, Inventors included the size of a header describing the weight and/or output dataset in the experiments described herein. When the size denoted n of the text to be compressed data element is large relative to the size m denoting the size of the alphabet, the amount of storage required to encode the weight and/or output dataset is often negligible. For larger alphabets, for example when words, instead of individual characters, are the data elements to be encoded (e.g., as described with reference to Alistair Moffat, '.*Word-based text compression,*" *Softly., Pract. Exper.* vol. 19, no. 2, pp. 185-198, 1989), the additional overhead of the encoding process described herein may not be justifiable, unless the text to be encoded is very large. For certain applications, like large full-text Information Retrieval Systems, this overhead may be ignored, since the list of different words and their frequencies are usually stored anyway as part of the standard auxiliary data called inverted files, for example, as described with reference to Justin Zobel and Alistair Moffat, "*Inverted files for text search engines,*" *ACM Comput. Suru.*, vol. 38, no. 2, pp. 6, 2006.

Reference is now made to FIG. 12, which is a table 1202 summarizing the compression performance results, in accordance with some embodiments of the present invention. A second column (heading full size MB) 1204 presents the original file sizes in MB. A third column (heading m) 1206 presents the size of the encoded alphabet (i.e., data elements). The following three columns, entitled STATIC 1208, FORWARD 1210 and DYNAMIC 1212, present the compression ratios achieved by the compared processes. The compression ratio is defined as the size of the compressed file divided by the size of the original file. The overhead of the description of the weight and/or output dataset is included in the size of the compressed file.

The results presented in table 1202 provide evidence that the compression process described herein is consistently better than static Huffman, as expected, and the traditional dynamic Huffman achieves the best results in most cases. However, the compression process described herein was better for the executable files that were tested, as well as when a large alphabet consisting of words has been used.

Inventors discovered a case in which compression by at least some systems, methods, apparatus, and/or code instructions described herein is twice as efficient as a traditional dynamic Huffman encoding process.

Dynamic Huffman coding repeatedly changes the shape of the tree used for encoding, but there is a delay between the occurrence of a change and when such a change starts to influence the encoding. At least some implementations of the systems, methods, apparatus, and/or code instructions described herein use the Huffman tree (i.e., coding and/or weight dataset) updated in the previous encoding stage for encoding the current character. The update to the weight dataset implied by the processed character affect the encoding in the subsequent stages, if at all. This behavior is demonstrated in the following example, comparing the performances of the standard dynamic Huffman encoding process with the encoding process described herein as implemented by at least some of systems, methods, apparatus, and/or code instructions described herein. The example shows that the file constructed by traditional dynamic Huffman may be about twice as large as that produced by the encoding process described herein.

Figure 13:
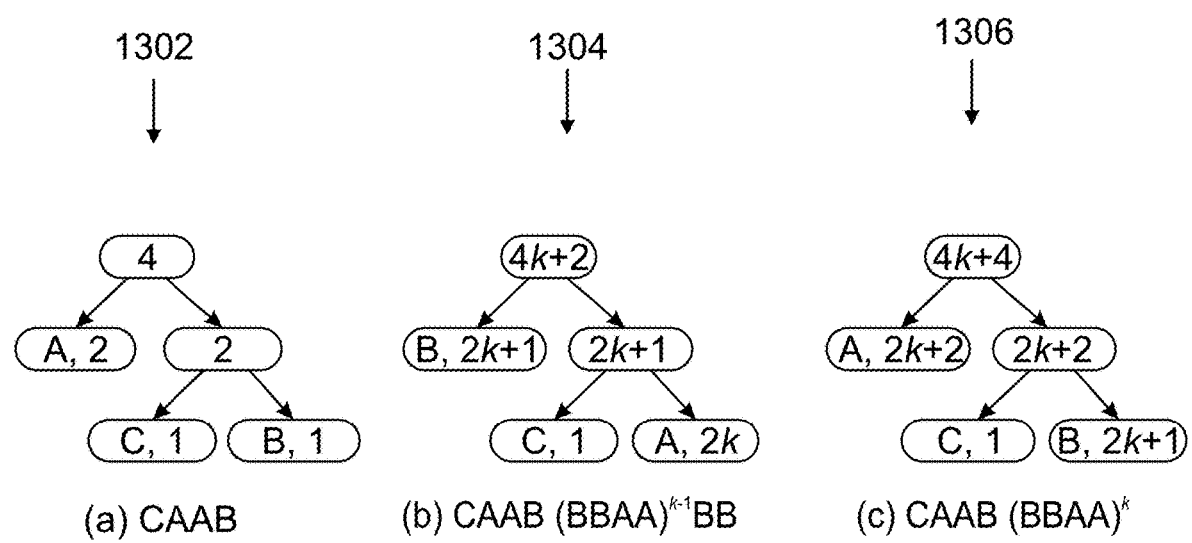
FIG. 13 includes tree coding and/or weight datasets, for depicting examples for which the traditional dynamic Huffman coding produces an encoded dataset that is twice the size of an encoded dataset computed by the encoding process described herein, in accordance with some embodiments of the present invention.

Reference is now made to FIG. 13, which includes tree coding and/or weight datasets 1302, 1304, and 1306, for depicting examples for which the traditional dynamic Huffman coding produces an encoded dataset that is twice the size of an encoded dataset computed by the encoding process described herein, in accordance with some embodiments of the present invention.

Let T=CAAB{BBAA}$^k$ for some positive integer denoted k. The Huffman coding tree is initialized with Σ={A, B, C} as depicted in 1302 for the prefix CAAB of T. For the standard dynamic Huffman approach, when the two Bs of the first quadruple BBAA are processed, only the second B causes a change in the structure of the Huffman tree, but this happens after the two Bs have already been encoded using 2 bits for each. The Huffman tree after reading the prefix CAABBB of T, is depicted in 1304. When the following two As of the first quadruple BBAA are processed, again the positions of the A and B nodes are swapped only after the frequency of A exceeds that of B, so each of the As is also encoded by 2 bits. The resulting Huffman tree after processing CAABBBAA is presented in 1306, and this is in fact the same Huffman tree as 1302. This alternation between two different structures of the Huffman tree proceeds for each of the BBAA quadruples, and every character of T (except the first two As) uses 2 bits, for a total of 8k+6.

In contrast, when compressing T using at least some implementations of the systems, methods, apparatus, and/or code instructions described herein, the coding and/or weight dataset (e.g., Huffman tree) may start with the static Huffman tree identical to that of 1302. Since the weight of the first read character C is 1, its node is deleted, and the Huffman tree is reduced to only two leaves, one for A and the other for B. All the codewords are then of length 1 and the size of the compressed dataset is exactly 4k+5, roughly half the size of the compressed dataset constructed by traditional dynamic Huffman methods.

In comparison, using traditional static Huffman coding, the tree would be 1306 and the size of the encoded baseline dataset would be 6k+6.

It is noted that the described example also shows that the standard dynamic Huffman coding may produce an encoding which is worse than that of static Huffman. The example provides further evidence that compression using at least some implementations of the systems, methods, apparatus, and/or code instructions described herein is at least as good as static Huffman.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

It is expected that during the life of a patent maturing from this application many relevant baseline datasets and data elements will be developed and the scope of the terms baseline datasets and data elements are intended to include all such new technologies a priori.

As used herein the term "about" refers to ±10%.

The terms "comprises", "comprising", "includes", "including", "having" and their conjugates mean "including but not limited to". This term encompasses the terms "consisting of" and "consisting essentially of".

The phrase "consisting essentially of" means that the composition or method may include additional ingredients and/or steps, but only if the additional ingredients and/or steps do not materially alter the basic and novel characteristics of the claimed composition or method.

As used herein, the singular form "a", "an" and "the" include plural references unless the context clearly dictates otherwise. For example, the term "a compound" or "at least one compound" may include a plurality of compounds, including mixtures thereof.

The word "exemplary" is used herein to mean "serving as an example, instance or illustration". Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments". Any particular embodiment of the invention may include a plurality of "optional" features unless such features conflict.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting. In addition, any priority document(s) of this application is/are hereby incorporated herein by reference in its/their entirety.

What is claimed is:

1. A computer implemented method of compressing a baseline dataset comprising a sequence of a plurality of instances of a plurality of unique data elements, the method comprising:
   creating a weight function that calculates a weight for each one of the plurality of instances of each one of the plurality of unique data elements in the baseline dataset, as a function of sequential locations of each of the plurality of instances of each respective unique data element within the baseline dataset;

creating an output dataset storing a codeword for each one of the unique data elements in the baseline dataset, wherein codewords are according to a compression rule defining data elements associated with a relatively higher weight as being associated with codewords that are relatively shorter in comparison to data elements associated with relatively lower weight;

dynamically creating the compressed dataset by sequentially iterating, for each current sequential location of the baseline dataset:

determining an encoded data element mapped to the respective data element of the current sequential location according to the weight function; and adjusting the codewords of the output dataset according to the current weights to maintain the compression rule.

2. The method of claim 1, wherein the weight of a certain instance of a certain data element at a current sequential location is computed as a function of values of the weight function computed for each instance of the certain data element for subsequent sequential locations following the current sequential location.

3. The method of claim 1, wherein the weight of a certain instance of a certain data element at a current sequential location is computed as a function of values of the weight function computed for each instance of the certain data element for previous sequential locations previous to the current sequential location.

4. The method of claim 1, wherein the value of the weight function decreases with increasing sequential locations away from a first sequential location of the baseline dataset.

5. The method of claim 4, wherein the weight function decreases linearly.

6. The method of claim 5, wherein each sequential location is indexed with a decreasing integer value from a start of the baseline dataset, representing the number of remaining plurality of instances of each one of the plurality of unique data elements in the baseline dataset.

7. The method of claim 1, further comprising creating a header comprising an initial weight for each one of the plurality of unique data elements in the baseline dataset computed for a first location of the baseline dataset according to the weight function computed for sequential locations of each of the plurality of instances of each respective unique data element, and providing the header and the compressed dataset to a decoder for decoding.

8. The method of claim 1, wherein the sequential iterations are performed until a single unique data element with at least one instance remains in the remaining portion of the baseline dataset, the output dataset excludes encodings of the remaining at least one instance of the single unique data element, and wherein a decoder computes a number of the remaining at least one instance of the single unique data element according to the weight of the single data element computed by the weight function for a last sequential location.

9. The method of claim 1, further comprising initializing a weighted tree associated with the values of the weight function computed for each of the plurality of data elements for a first sequential position, and the output dataset is considered as being equivalent to the weighted tree, the weighted tree having a number of leaves corresponding to a number of unique data elements.

10. The method of claim 9, wherein the weight tree comprises a Huffman tree.

11. The method of claim 1, wherein the baseline dataset having a baseline data storage size is compressed to generate the compressed dataset having a data storage size that is smaller than the baseline data storage.

12. The method of claim 1, wherein the dynamically creating the compressed dataset is implemented as a statistical encoder.

13. The method of claim 12, wherein the statistical encoder is selected from a group consisting of: dynamic Huffman coding, adaptive arithmetic coding, and Prediction by Partial Mapping (PPM).

14. The method of claim 1, wherein the data elements are selected as belonging to an alphabet.

15. The method of claim 14, wherein the alphabet is selected from the group consisting of: ASCII, EBCDIC, and UNICODE.

16. A system for compressing a baseline dataset comprising a sequence of a plurality of instances of a plurality of unique data elements, the system comprising:

at least one hardware processor executing a code for:

creating a weight function that calculates a weight for each one of the plurality of instances of each one of the plurality of unique data elements in the baseline dataset, as a function of sequential locations of each of the plurality of instances of each respective unique data element within the baseline dataset;

creating an output dataset storing a codeword for each one of the unique data elements in the baseline dataset, wherein codewords are according to a compression rule defining data elements associated with a relatively higher weight as being associated with codewords that are relatively shorter in comparison to data elements associated with relatively lower weight;

dynamically creating the compressed dataset by sequentially iterating, for each current sequential location of the baseline dataset:

determining an encoded data element mapped to the respective data element of the current sequential location according to the weight function; and adjusting the codewords of the output dataset according to the current weights to maintain the compression rule.

17. A computer implemented method of compressing a baseline dataset comprising a sequence of data elements, the method comprising:

creating a weight dataset that stores a weight of each one of the data elements in the baseline dataset and an associated output dataset storing a codeword for each one of the data elements in the baseline dataset, wherein codewords are according to a compression rule defining data elements associated with a relatively higher weight as being associated with codewords that are relatively shorter in comparison to data elements associated with relatively lower weight;

dynamically creating the compressed dataset by sequentially computing, for each respective data element of the baseline dataset:

an encoded data element mapped to the respective data element according to the weight dataset;

updating the weight dataset by decrementing the weight of the respective data element; and adjusting the codewords of the output dataset according to the updating to maintain the compression rule.

18. The method of claim 17, wherein the baseline dataset having a baseline data storage size is compressed to generate the compressed dataset having a data storage size that is smaller than the baseline data storage.

19. The method of claim 17, further comprising removing a certain data element and associated codeword from the weight dataset and output dataset when the weight of the certain data element reaches a value indicating a last occurrence of the certain data element in the remaining portion of the baseline dataset.

20. The method of claim 17, wherein the weight associated with a certain data element is indicative of a frequency of the certain data element in the remaining portion of the baseline dataset.

* * * * *